United States Patent
Zhu et al.

(10) Patent No.: US 12,334,279 B2
(45) Date of Patent: Jun. 17, 2025

(54) COMPOSITIONS AND METHODS FOR MODIFYING PEROVSKITE SURFACES

(71) Applicant: Alliance for Sustainable Energy, LLC, Golden, CO (US)

(72) Inventors: Kai Zhu, Littleton, CO (US); Fei Zhang, Tianjin (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 2 days.

(21) Appl. No.: 18/558,473

(22) PCT Filed: May 24, 2022

(86) PCT No.: PCT/US2022/030709
§ 371 (c)(1),
(2) Date: Nov. 1, 2023

(87) PCT Pub. No.: WO2022/251201
PCT Pub. Date: Dec. 1, 2022

(65) Prior Publication Data
US 2024/0224549 A1 Jul. 4, 2024

Related U.S. Application Data

(60) Provisional application No. 63/192,918, filed on May 25, 2021.

(51) Int. Cl.
*H01G 9/20* (2006.01)
*C07F 19/00* (2006.01)
*H10K 30/10* (2023.01)
*H10K 30/15* (2023.01)
*H10K 30/40* (2023.01)
(Continued)

(52) U.S. Cl.
CPC ......... *H01G 9/2009* (2013.01); *C07F 19/005* (2013.01); *H10K 30/10* (2023.02); *H10K 30/151* (2023.02); *H10K 30/40* (2023.02); *H10K 85/50* (2023.02); *H10K 30/50* (2023.02)

(58) Field of Classification Search
CPC .... H01G 9/2009; H10K 30/151; H10K 30/40; H10K 30/10; H10K 85/50
See application file for complete search history.

(56) References Cited

U.S. PATENT DOCUMENTS

2022/0059780 A1 2/2022 Zhu et al.

OTHER PUBLICATIONS

Zhang et al., "Surface lattice engineering through three-dimensional lead iodide perovskitoid for high-performance perovskite solar cells", Chem 7, 774-785, Mar. 11, 2021. (Year: 2021).*

(Continued)

*Primary Examiner* — Tae-Sik Kang
(74) *Attorney, Agent, or Firm* — Michael A. McIntyre

(57) ABSTRACT

The present disclosure relates to a composition that includes a first layer that includes a perovskite and a second layer that includes a perovskitoid, where the perovskite has a first crystalline structure defined by $ABX_3$, the perovskitoid has a second crystalline structure defined by $A'B_2X_6$, where A is a first cation, B is a second cation, X is an anion, and A' is a third cation having either a 1+ charge or a 2+ charge.

20 Claims, 33 Drawing Sheets

(51) Int. Cl.
*H10K 85/50* (2023.01)
*H10K 30/50* (2023.01)

(56) References Cited

OTHER PUBLICATIONS

Pham et al., "1D Pyrrolidinium Lead Iodide for Efficient and Stable Perovskite Solar Cells", Energy Technol. 2020, 8, 1900918. (Year: 2020).*
Chen, P. et al., "In Situ Growth of 2D Perovskite Capping Layer for Stable and Efficient Perovskite Solar Cells," Advanced Functional Materials, vol. 28, 2018, 10 pages.
Chen, X. et al., "Impact of Layer Thickness on the Charge Carrier and Spin Coherence Lifetime in Two-Dimensional Layered Perovskite Single Crystals," ACS Energy Letters, vol. 3, 2018, 7 pages.
Gangadharan, D.T. et al., "Search for stability at lower dimensions: current trends and future prospects of layered perovskite solar cells," RSC Energy & Environmental Science, vol. 12, 2019, 30 pages.
Gao, L. et al., "Enhanced Charge Transport by Incorporating Formamidinium and Cesium Cations into Two-Dimensional Perovskite Solar Cells," Angewandte Chemie, vol. 131, 2019, 5 pages.
Jiang, Q. et al., "Surface passivation of perovskite film for efficient solar cells," Nature Photonics, vol. 13, Jul. 2019, 10 pages.
Kim, D.H. et al., "300% Enhancement of Carrier Mobility in Uniaxial-Oriented Perovskite Films Formed by Topotactic-Oriented Attachment," Advanced Materials, vol. 29, 2017, 8 pages.
Khenkin, M.V. et al., "Consensus statement for stability assessment and reporting for perovskite photovoltaics based on ISOS procedures," Nature Energy, vol. 5, Jan. 2020, 15 pages.
Koh, T.M. et al., "Enhancing moisture tolerance in efficient hybrid 3D/2D perovskite photovoltaics," RSC Journal of Materials Chemistry A, vol. 6, 2018, 7 pages.
Li, G. et al.., "Polysulfide Regulation by the Zwitterionic Barrier toward Durable Lithium-Sulfur Batteries," Journal of the American Chemical Society, vol. 142, 2020, 10 pages.
Li, X. et al., "Three-Dimensional Lead Iodide Perovskitoid Hybrids with High X-ray Photoresponse," Journal of the American Chemical Society, vol. 142, 2020, 13 pages.
Liang, L. et al., "Efficient Perovskite Solar Cells by Reducing Interface-Mediated Recominationa: a Bulky Amine Approach," Advanced Energy Materials, vol. 10, 2020, 12 pages.
Liu, B. et al., "Interfacial charge behaior modulation in 2D/3D perovskite heterostructure for potential high-performance solar cells," Nano Energy, vol. 59, 2019, 6 pages.
Liu, X. et al., "Dopant-free and low-cost molecular "bee" hole-transporting materials for efficient and stable perovskite solar cells," RSC Journal of Materials Chemistry C, vol. 5, 2017, 7 pages.
Liu, Y. et al., "Ultrahydrophobic 3D/2D fluoroarene bilayer-based water-resistant perovskite solar cells with efficiencies exceeding 22%," Science Advances, vol. 5, 2019, 9 pages.
Liu, Y. et al., "Stabilization of Highly Efficient and Stable Phase-Pure FAPbI3 Perovskite Solar Cells by Molecularly Tailored 2D-Overlayers," Angew. Chem. Int. Ed., vol. 59, 2020, 7 pages.
Lu, H. et al., "Spin-dependent charge transport through 2D chiral hybrid lead-iodide perovskites," Science Advances, vol. 5, 2019, 8 pages.
Luo, D. et al., "Enhanced photovoltage for inverted planar heterojunction perovskite solar cells," Science, vol. 360, 2018, 6 pages.
Mao, L. et al., "Hybrid Dion-Jacobson 2D Lead Iodide Perovskites," Journal of the American Chemical Society, vol. 140, 2018, 9 pages.
Min, H. et al., "Efficient, stable solar cells by using inherent bandgap of α-phase formamidinium lead iodide," Science, vol. 366, 2019, 6 pages.
Niu, T. et al., "Interfacial Engineering at the 2D/3D Heterojunction for High-Performance Perovskite Solar Cells," Nano Letters, vol. 19, 2019, 10 pages.
Perkins, C. et al., "Surfactant-assisted growth of CdS thin films for photovoltaic applications," Journal of Vac. Sci. Technol. A 24(3), May/Jun. 2006, 8 pages.
Stoumpos, C. S. et al., "Structure-Band Gap Relationships in Hexagonal Polytypes and Low-Dimensional Structures of Hybrid Tin Iodide Perovskites," ACS Inorganic Chemistry, vol. 56, 2017, 18 pages.
Wang, Y. et al., "Efficient α-CsPbI3 Photovoltaics with Surface Terminated Organic Cations," Joule, vol. 2, 2018, 12 pages.
Xiao, C. et al., Junction Quality of SnO2-Based Perovskite Solar Cells Investigated by Nanometer-Scale Electrical Potential Profiling, Applied Materials & Interfaces, vol. 9, 2017, 8 pages.
Ye, J. Y. et al., "Enhancing Charge Transport of 2D Perovskite Passivation Agent for Wide-Bandgap Perovskite Solar Cells Beyond 21%," Solar RRL, vol. 4, 2020, 8 pages.
Zhang, F. et al., "Additive Engineering for Efficient and Stable Perovskite Solar Cells," Advanced Energy Materials, vol. 10, 2020, 26 pages.
Zhang, F. et al., "Enhanced Charge Transport in 2D Perovskites via Fluorination of Organic Cation," Journal of the American Chemical Society, vol. 141, 2019, 8 pages.
Zhang, F. et al., "Advances in two-dimensional organic-inorganic hybrid perovskites," RSC Energy & Environmental Science, vol. 13, 2020, 33 pages.
Zhang, F. et al., "Surface lattice engineering through three-dimensional lead iodide perovskitoid for high-performance perovskite solar cells," Chem, vol. 7, 2021, 13 pages.
Zhao, H. et al., "Enhanced stability and optoelectronic properties of MAPbI3 films by a cationic surface-active agent for perovskite solar cells," RSC Journal of Materials Chemistry A, vol. 6, 2018, 10 pages.
Zhou, Q. et al., "High-Performance Perovskite Solar Cells with Enhanced Environmental Stability Based on a (p-FC6H4C2H4NH3)2[PbI4] Capping Layer," Advanced Energy Materials, vol. 9, 2019, 11 pages.
Zhu, H. et al., "Tailored Amphiphilic Molecular Mitigators for Stable Perovskite Solar Cells with 23.5% Efficiency," Advanced Materials, vol. 32, 2020, 8 pages.
Zhu, K. et al., "3D/2D multidimensional perovskites: Balance of high performance and stability for perovskite solar cells," Elsevier Science, vol. 11, 2018, 9 pages.
PCT/US22/30709 Search Report and Written Opinion, issued Sep. 29, 2022; 7 pages total.

* cited by examiner

A

α-ABX₃

B

β-ABX₃

C

γ-ABX₃

A

B

COMPOSITIONS AND METHODS FOR MODIFYING PEROVSKITE SURFACES

CROSS-REFERENCE TO RELATED APPLICATIONS

This application claims priority from U.S. Provisional Patent Application No. 63/192,918 filed on May 25, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Organic metal halide perovskite solar cells (PSCs) have attracted significant attention due to their rapidly enhanced power conversion efficiency (PCE) from 3.8% to above 25%. Solution processing may be a preferred method for manufacturing PSCs on a manufacturing scale, however a wide range of defects can form depending on the precursor compositions and processing conditions. The use of low-dimensional (LD) structures, e.g., two-dimensional (2D) and one-dimensional (1D), based on bulky organic cations may improve both the performance and stability of three-dimensional (3D)-perovskite-based solar cells. However, the use of such LD structures can act as a charge-extraction barrier and inhibit device performance. Thus, there remains a need for improved methods and compositions that can overcome these problems and reduce and/or eliminate surface defects on perovskite layers resulting from large-scale solution processing.

SUMMARY

An aspect of the present disclosure is a composition that includes a first layer that includes a perovskite and a second layer that includes a perovskitoid, where the perovskite has a first crystalline structure defined by $ABX_3$, the perovskitoid has a second crystalline structure defined by $A'B_2X_6$, where A includes a first cation, B includes a second cation, X includes an anion, and A' includes a third cation having either a 1+ charge or a 2+ charge. In some embodiments of the present disclosure, A' may have a characteristic length between 2.53 Å and 7.62 Å. In some embodiments of the present disclosure, the characteristic length may be between 2.72 Å and 7.06 Å.

In some embodiments of the present disclosure, the second crystalline structure may have a 3D crystal structure. In some embodiments of the present disclosure, the 3D structure may have a centrosymmetric orthorhombic space group Pbam. In some embodiments of the present disclosure, the second crystalline structure may be characterized by having at least one octahedra dimer having a composition consisting of $Pb_2I_6^{2-}$. In some embodiments of the present disclosure, A' may include at least one of N-methyl-1,3-propane diammonium (Me-PDA) and/or 1,4-bis(aminomethyl)benzene (p-PBA).

In some embodiments of the present disclosure, the perovskite may include $FA_{1-x-y}MA_xCs_yPb(I_{1-z}Br_z)_3$, where $0 \le x \le 1$, $0 \le y \le 1$, and $0 \le z \le 1$. In some embodiments of the present disclosure, the second layer may have a surface roughness less than or equal to about 16 nm. In some embodiments of the present disclosure, the composition may be characterized by a yield mobility product ($\varphi\Sigma\mu$) of at least about 50.0 cm²/Vs. In some embodiments of the present disclosure, the composition may be characterized by a charge-carrier lifetime of at least about 1.5 microseconds. In some embodiments of the present disclosure, the composition may be characterized by an out-of-plane charge transport between $(1-3) \times 10^{-3}$ cm²V⁻¹s⁻¹ and $1 \times 10^{-1}$ cm²V⁻¹s⁻¹. In some embodiments of the present disclosure, the second layer nay uniformly cover the first layer.

An aspect of the present disclosure is a device that includes a first layer that includes a perovskite and a second layer that includes a perovskitoid, where the perovskite has a first crystalline structure $ABX_3$, the perovskitoid has a second crystalline structure $A'B_2X_6$, A includes a first cation, B includes a second cation, X includes an anion, and A' includes a third cation having either a 1+ charge or a 2+ charge.

An aspect of the present disclosure is a device that includes, in order, a glass substrate, a layer that includes fluorine-doped tin oxide, a layer that includes compact $TiO_2$, a layer that includes mesoporous $TiO_2$, a layer that includes a perovskite, a layer that includes a perovskitoid, a layer that includes a hole-transport material (HTL), and a metal layer.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 18A (Panel A) PCE and (Panel B) J$_{sc}$, and FIG. 18B (Panel A) V$_{oc}$, and (Panel B) FF.

FIG. 20A MAPbI$_3$ and FIG. 20B (FAPbI$_3$)$_{0.85}$(MAPbBr$_3$)$_{0.15}$. The device structure was glass/FTO/compact TiO$_2$/mesoporous TiO$_2$/perovskite/spiro-OMeTAD/Au.

REFERENCE NUMBERS

Figure 1A:
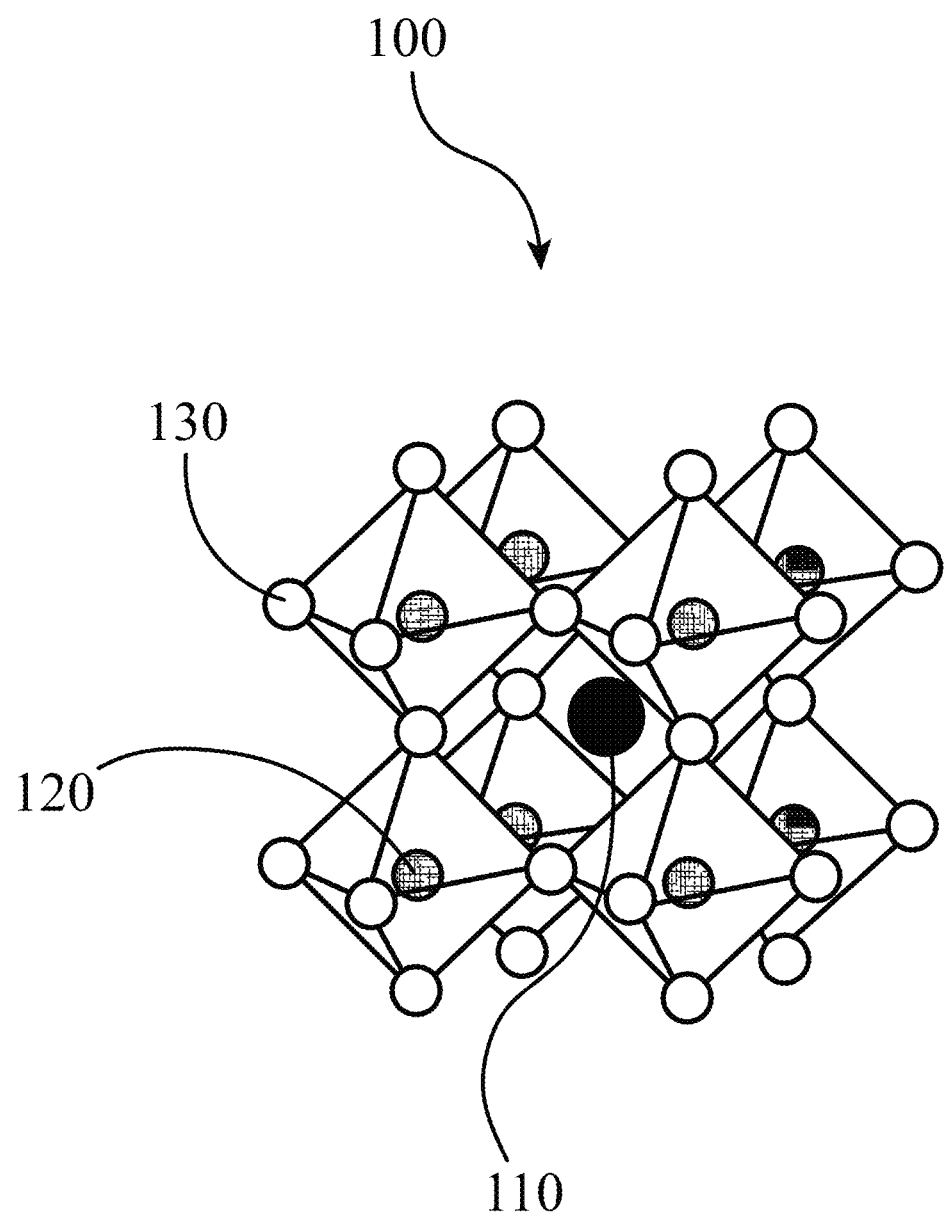
FIGS. 1A and 1B illustrate a perovskite in a corner-sharing, cubic phase arrangement, according to some embodiments of the present disclosure.

100 . . . perovskite
110 . . . A-cation
120 . . . B-cation
130 . . . X-anion
400 . . . composition
410 . . . first layer
420 . . . second layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to compositions and method for modifying the surfaces of organic-inorganic halide perovskite layers resulting in the enhanced performance and stability of PSCs utilizing the perovskite layers as active layers. For example, as shown herein, a bulky cation, e.g., N-methyl-1,3-propane diammonium diiodide (Me-PDAI$_2$), may be used to treat the surface of a variety of 3D perovskite layers, resulting in the formation of an additional thin solid 3D layer of a crystalline structure incorporating the bulky cation positioned on the surface of the underlying 3D perovskite layer. For the example of Me-PDAI$_2$ as the bulky cation used in the surface treatment, the layer having the resultant crystalline structure has the composition of (Me-PDA)Pb$_2$I$_6$ and a crystal structure referred to herein as a "perovskitoid". Among other things, such surface treating with a bulky cation can result in a final perovskite-containing structure (e.g., layer and/or composite layers) having a range of improved performance metrics and physical properties; smoother surface texture, longer charge-carrier lifetime, higher charge-carrier mobility, and a reduced surface-defect density. As shown herein, these improvements to physical properties and performance metrics can increase the efficiency of a PSC utilizing a perovskite active layer that includes the perovskitoid layer from 20.3% to 22.0%, along with much improved operational stability and shelf-life.

Figure 1B:
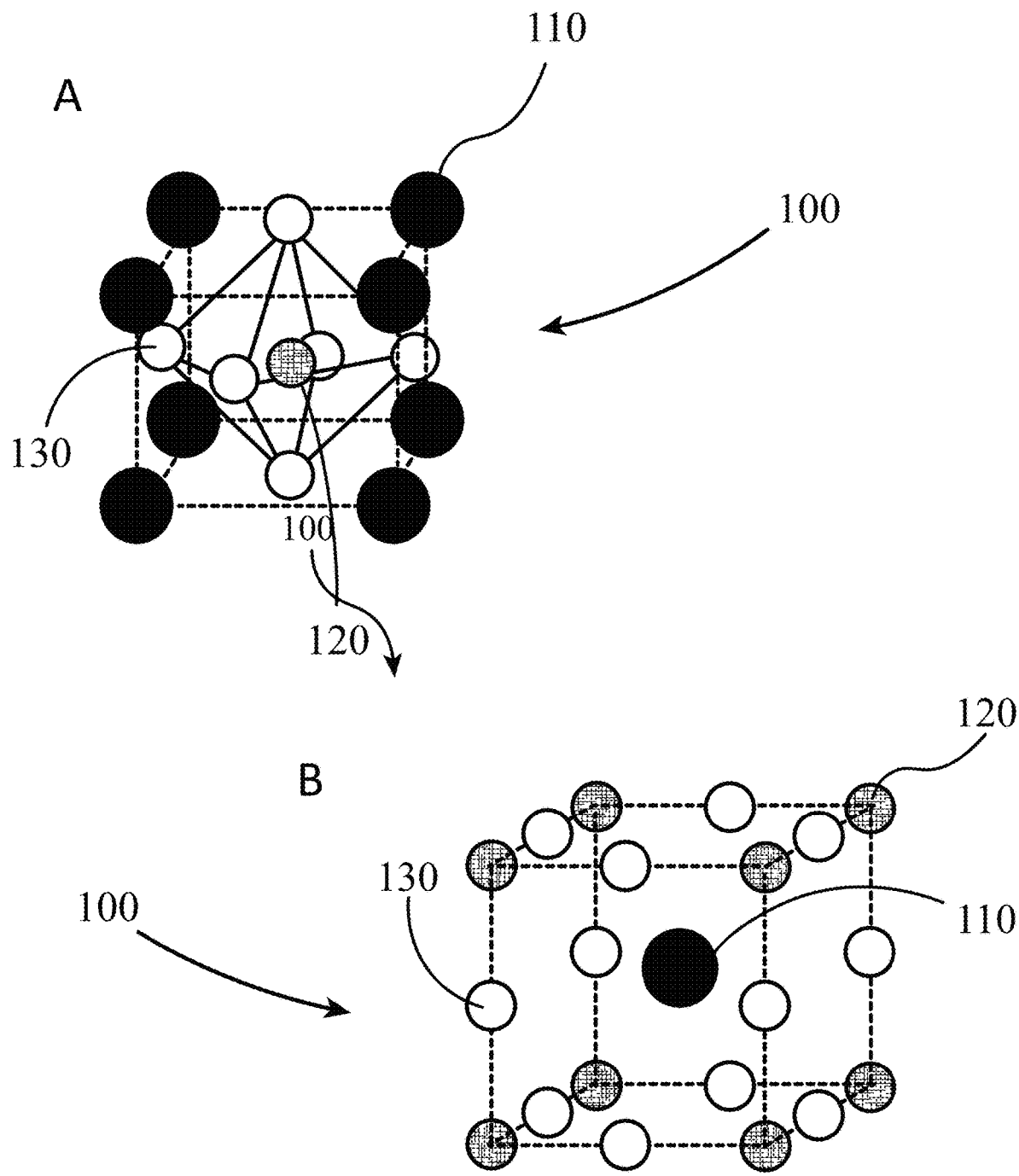

In general, the term "perovskite" refers to compositions having a network of corner-sharing BX$_6$ octahedra resulting in the general stoichiometry of ABX$_3$. FIGS. 1A and 1B illustrate that perovskites 100, for example metal halide perovskites, may organize into a three-dimensional (3D) cubic crystalline structures (i.e., α-phase or α-ABX$_3$) constructed of a plurality of corner-sharing BX$_6$ octahedra. In the general stoichiometry for a perovskite, ABX$_3$, X (130) is an anion and A (110) and B (120) are cations, typically of different sizes. FIG. 1A illustrates that a perovskite 100 having an α-phase structure may be further characterized by eight BX$_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 1B provides another visualization of a perovskite 100 in the α-phase, also referred to as the cubic phase. This is because, as shown in FIG. 1B, a perovskite in the α-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B, the A-cations 110, the B-cations 120, and the X-anions 130 balance to the general formula ABX$_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 1B, the stoichiometry simplifies to B=1, A=8*0.125=1, and X=6*0.5=3, or ABX$_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or ABX$_3$. Referring again to Panel B of FIG. 1B, the X-anions 130 and the B-cations 120 of a perovskite in the α-phase are aligned along an axis; e.g., where the angle at the X-anion 130 between two neighboring B-cations 120 is exactly 180 degrees, referred to herein as the tilt angle. However, as shown in FIG. 2A, a perovskite 100 may assume other corner-sharing crystalline phases having tilt angles not equal to 180 degrees.

Figure 2A:
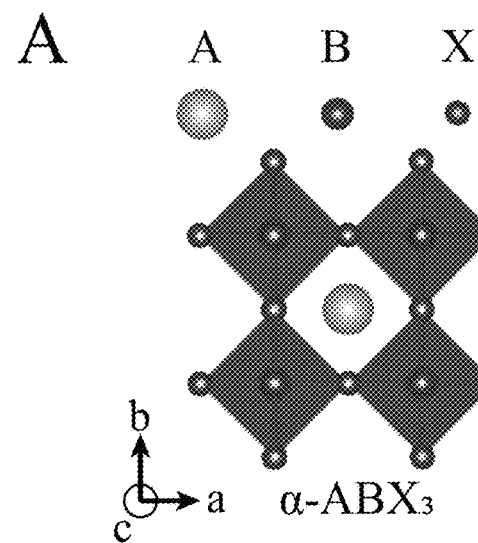
FIG. 2A illustrates three possible corner-sharing phases for perovskites, Panel A cubic phase (i.e., $\alpha$-$ABX_3$), Panel B a tetragonal crystalline phase (i.e., $\beta$-$ABX_3$), and Panel C an orthorhombic crystalline phase (i.e., $\gamma$-$ABX_3$), according to some embodiments of the present disclosure.
Figure 2A:
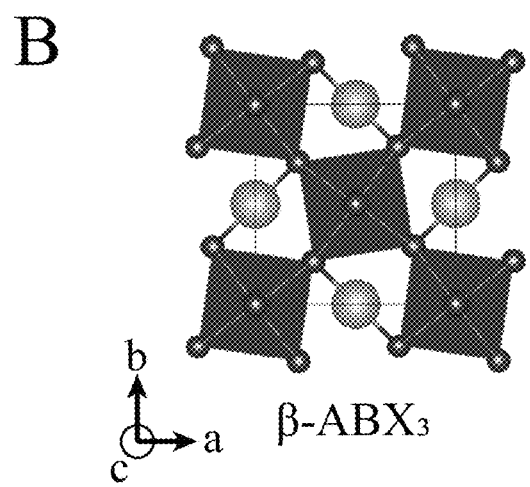
Figure 2A:
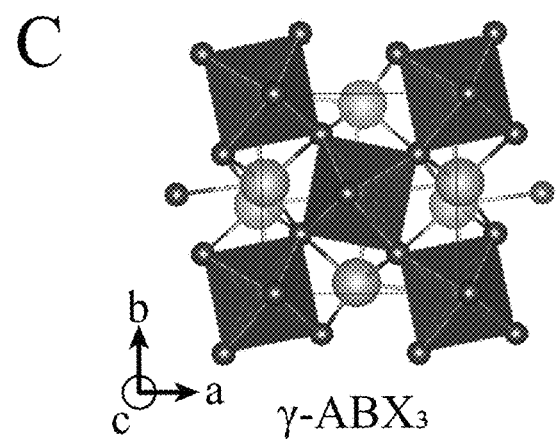

FIG. 2A illustrates that a perovskite can assume other crystalline forms while still maintaining the criteria of an ABX$_3$ stoichiometry with neighboring BX$_6$ octahedra maintaining X anion (130) corner-sharing. Thus, in addition to α-ABX$_3$ perovskites (in the cubic phase) having a tilt angle of 180 degrees, shown in Panel A of FIG. 2A, a perovskite may also assume a tetragonal crystalline phase (i.e., β-ABX$_3$) (see Panel B of FIG. 2A) and/or an orthorhombic crystalline phase (i.e., γ-ABX$_3$) (see Panel C of FIG. 2A), where the adjacent octahedra are tilted relative to the reference axes a, b, and c.

Figure 2B:
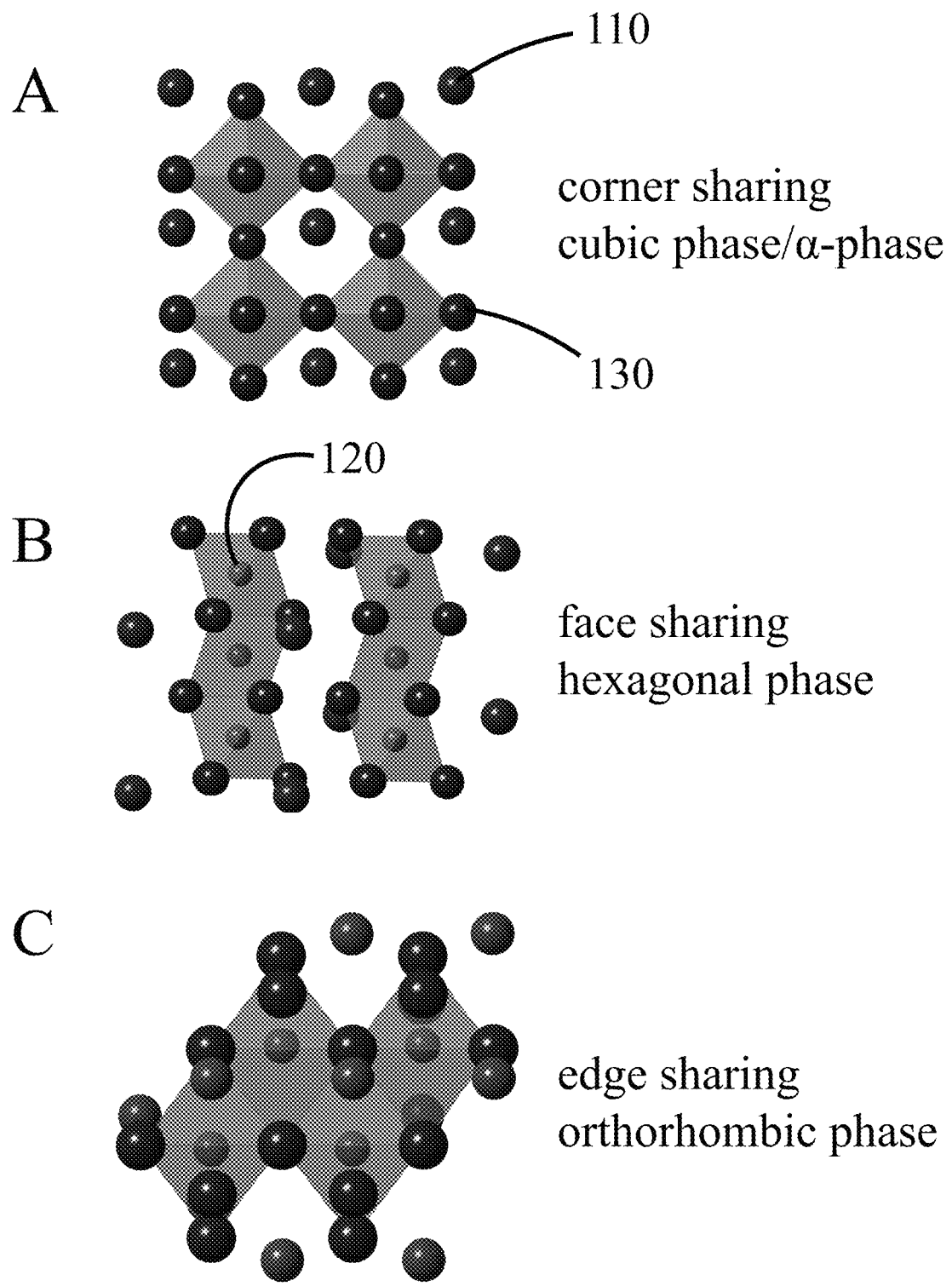
FIG. 2B illustrates a perovskite in one of the three possible phases, the cubic phase (i.e., $\alpha$-phase), compared to two non-perovskite phases (i.e., non-corner sharing), according to some embodiments of the present disclosure.

FIG. 2B illustrates that the elements used to construct a perovskite, as described above, A-cations 110, B-cations 120, and X-anions 130, may result in 3D non-perovskite structures; i.e., structures where neighboring BX$_6$ octahedra are not X-anion 130 corner-sharing and/or do not have a unit structure that simplifies to the ABX$_3$ stoichiometry. Referring to FIG. 2B, Panel A illustrates a perovskite in the cubic phase, i.e., α-ABX$_3$, compared to a non-perovskite structure constructed of face-sharing BX$_6$ octahedra resulting in a hexagonal crystalline structure (see Panel B of FIG. 2B) and a non-perovskite structure constructed of edge-sharing BX$_6$ octahedra resulting in an orthorhombic crystalline structure (see Panel C of FIG. 2B).

Figure 3:
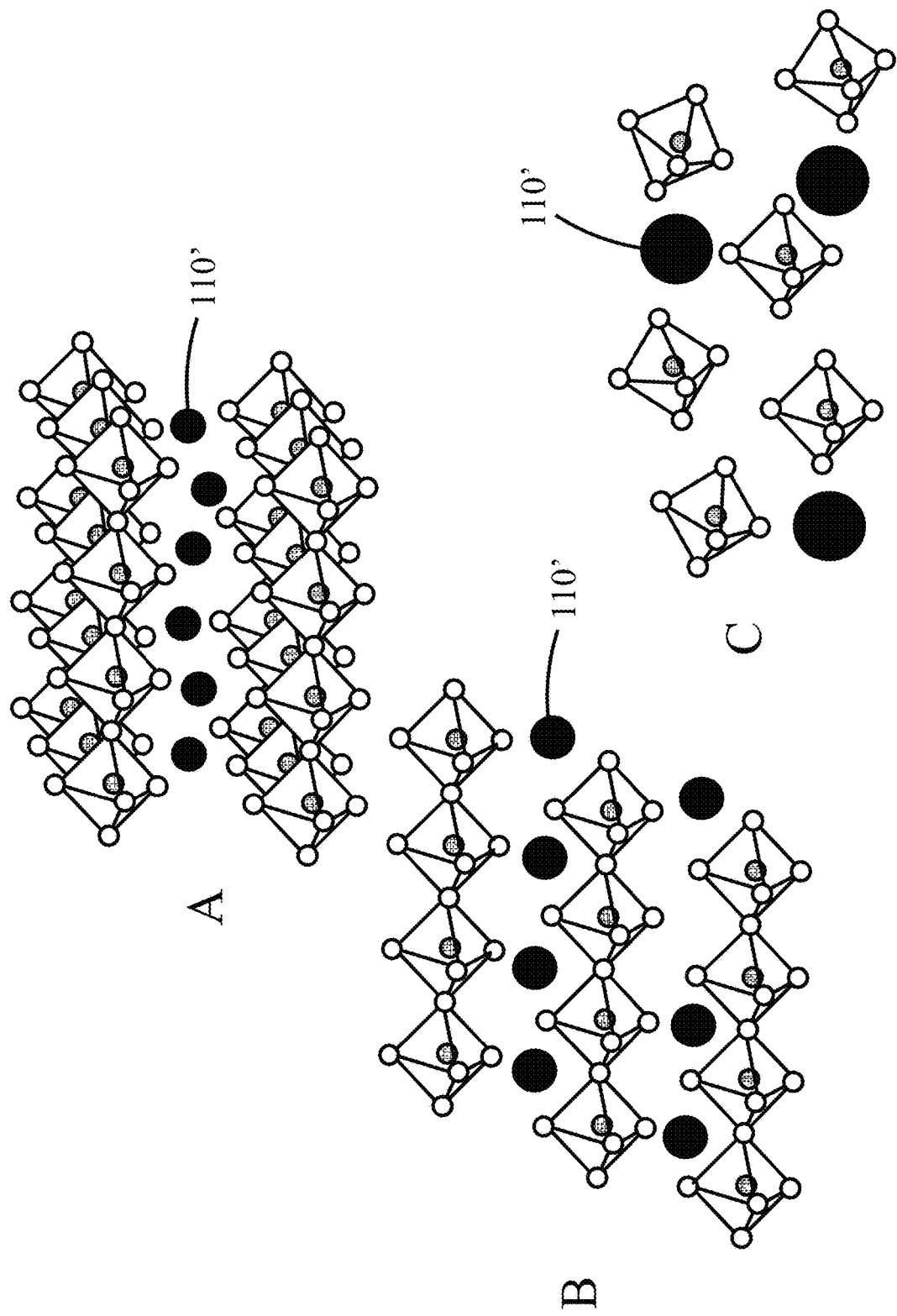
FIG. 3 illustrates 2D, 1D, and 0D perovskite-like structures, in Panels A, B, and C, respectively, according to some embodiments of the present disclosure.

Further, referring now to FIG. 3, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 3, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Figure 4:
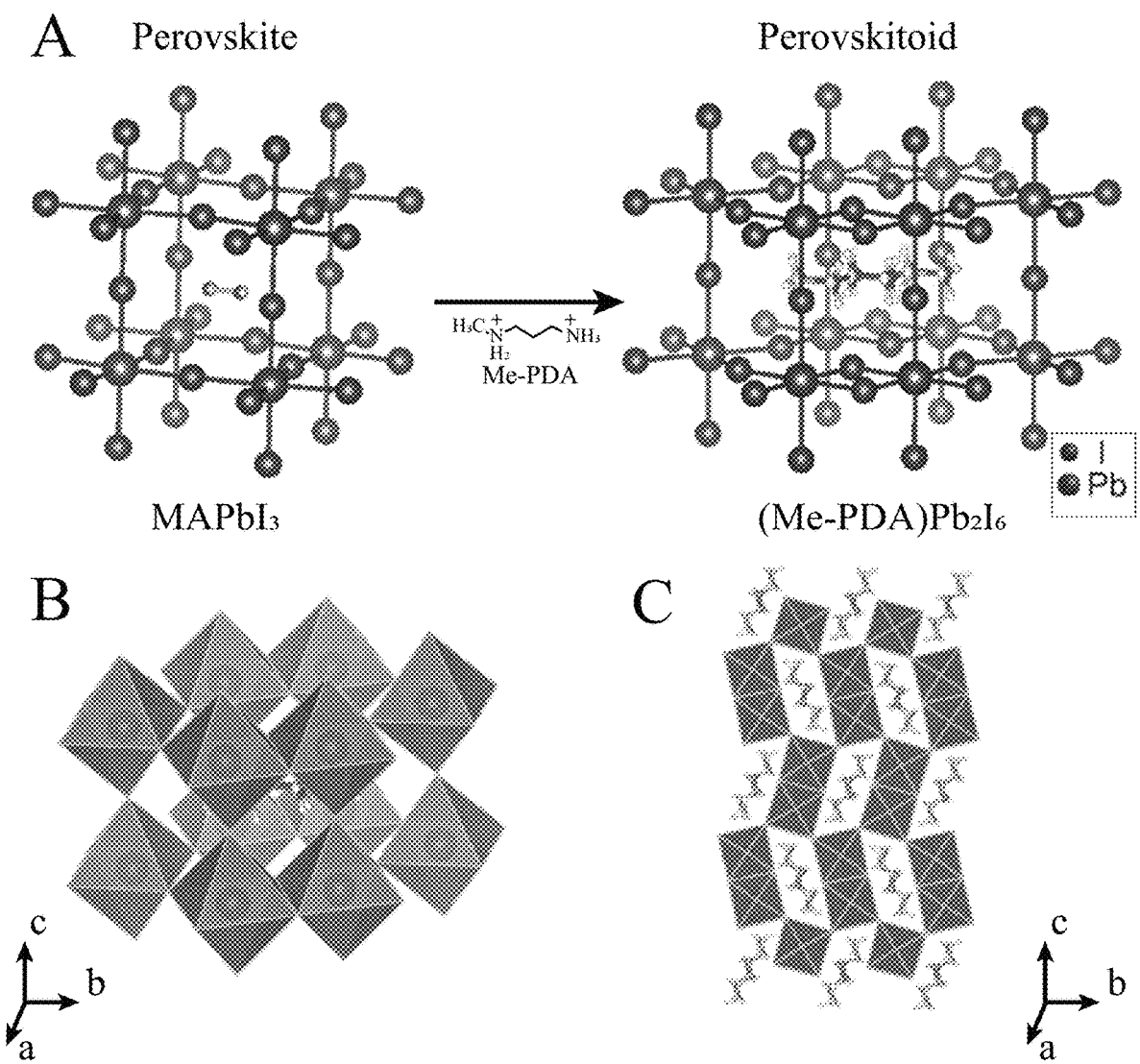
FIG. 4 illustrates a comparison of the crystal structure of (Me-PDA)$Pb_2I_6$, an exemplary perovskitoid to a conventional 3D perovskite, $MAPbI_3$, according to some embodiments of the present disclosure.

Referring to Panel A of FIG. 3, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}BnX_{3n+1}$, where monovalent (m=2) or divalent (m=1) A' cations 110' can intercalate between the X-anions of 2D perovskite-like sheets. Referring to Panel B of FIG. 3, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 3, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material. For simplification, as used herein the term "perovskite" will refer to each of the structures illustrated in FIGS. 1A through 4, unless specified otherwise. Thus, unless specified otherwise, the term "perovskite" as used herein includes each of a true corner-sharing $ABX_3$ perovskite, as illustrated in FIGS. 1A and 1B and Panel A of FIG. 2A, as well as perovskite-like compositions having 0D, 1D, and/or 2D structures like those shown in FIG. 3, as well as non-perovskites such as the perovskitoid as illustrated in FIG. 4 and described in more detail below and the structures illustrated in Panels B and C of FIG. 2B.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_5$) and the like.

Examples of metal B-cations 120 include, for example, lead, tin, germanium, and or any other 2+ valence state metal that can charge-balance the perovskite 100. Further examples include transition metals in the 2+ state such as Mn, Mg. Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 1A and 1B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B_2^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example Cs$_3$Sb$_2$I$_9$. For each of these examples, A is one or more cations, or for a mixed perovskite, A is two or more cations.

FIG. 4 compares the crystal structure of (Me-PDA)Pb$_2$I$_6$, an exemplary "perovskitoid", with MAPbI$_3$ (perovskite) having a conventional 3D perovskite structure. At room temperature, (Me-PDA)Pb$_2$I$_6$ crystallizes into centrosymmetric orthorhombic space-group Pbam. The crystal structure includes 3D corner-sharing octahedra dimers (Pb$_2$I$_6^{2-}$), which can be derived from the conventional perovskite structure by replacing every octahedron with an edge-sharing octahedra dimer as the basic motif (see Panel A of FIG. 4). The formula (Me-PDA)Pb$_2$I$_6$ can be viewed as double that of the perovskite ABX$_3$ formula. The octahedra dimers are formed by edge-sharing two octahedra along the b direction (a=8.9437(4) Å, b=17.4542(6) Å, c=6.4591(3) Å), which are then connected by corner-sharing along a, b, and c directions (see Panels B and C of FIG. 4) to form the 3D framework. The organic diammonium cations Me-PDA$^{2+}$, i.e., the bulky cations, occupy the rectangular A-site cavities, with the longer molecular axis packing along the b direction. The tilting angle of Me-PDA$^{2+}$ cations from b axis exactly follows the tilting angle of the parallel octahedra dimers (see Panel C of FIG. 4). Clearly, without forming the edge-sharing dimers as the basic motif, the bulky organic cation Me-PDA$^{2+}$ cannot be accommodated in the traditional A-site locations of the conventional ABX$_3$ perovskite structure.

Figure 5:
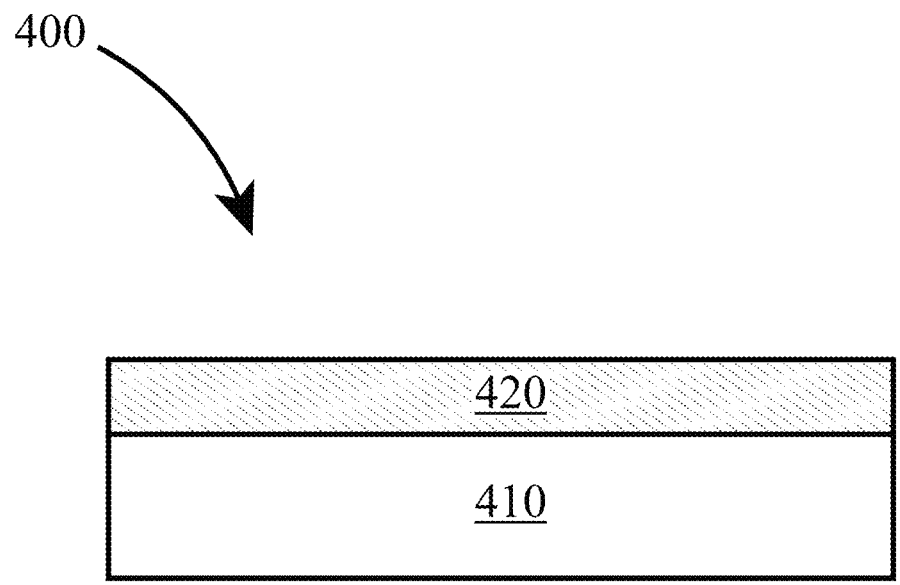
FIG. 5 illustrates a composition and/or device, according to some embodiments of the present disclosure.

FIG. 5 illustrates a composition 400, according to some embodiments of the present disclosure. The composition 400 includes a first layer 410 of a first perovskite having a first crystalline structure and a second layer 420 of a second perovskite having a second crystalline structure, where the first layer 410 and the second layer 420 are physically in contact. In some embodiments of the present disclosure, the first crystalline structure may be substantially a 3-dimensional (3D) perovskite structure and the second crystalline structure may be substantially a perovskitoid structure, as described above. As shown herein, such a composition may have at least one of a physical property or a performance metric that is improved when compared to a reference composition that is substantially the same as the composition shown in FIG. 5 but is absent the second layer.

In some embodiments of the present disclosure, the first crystalline structure, 3D perovskite, may have a composition defined by ABX$_3$, where A includes a first cation, B includes a second cation, and X includes an anion, as shown in FIGS. 1A, 1B, and 1C. In some embodiments of the present disclosure, the second crystalline structure may have a composition defined by A'B$_2$X$_6$ as shown in FIG. 4, where A' includes a third cation having either a 1+ charge or a 2+ charge. In some embodiments of the present disclosure, A' may have a characteristic length between about 2.53 Å and about 7.62 Å or between about 2.72 Å and about 7.06 Å. In some embodiments of the present disclosure, A' may include N-methyl-1,3-propane diammonium diiodide (Me-PDA) and/or 1,4-bis(aminomethyl)benzene (p-PBA). The first layer 410 may have a thickness between about 100 nm and about 2000 nm. The second layer 420 may have a thickness between about 1 nm and about 100 nm.

In some embodiments of the present disclosure, the improved physical property and/or performance metric of the composition 400 having a second layer 420 may include at least one of an improved out-of-plane charge transport, an improved yield-mobility product, a smoother surface, a reduced layer roughness, a longer charge-carrier lifetime, a higher charge-carrier mobility, and/or a reduced surface-defect density. In some embodiments of the present disclosure, the root-mean-square of the surface roughness of the second layer 420 may be less than or equal to about 16 nm or between 5 nm and 16 nm. In some embodiments of the present disclosure, for a perovskite layer treated as described herein to form a perovskitoid layer positioned on the perovskite layer, the yield mobility product ($\varphi\Sigma\mu$) may be at least about 52.8 cm$^2$/Vs or between 50 cm$^2$/Vs and 100 cm$^2$/Vs. In some embodiments of the present disclosure, the charge-carrier lifetime may be at least about 1.8 microseconds or between 1.5 microseconds and 5 microseconds. In some embodiments of the present disclosure, the out-of-plane charge transport of Me-PDA-containing structures and/or compositions may be greater than the out-of-plane transport demonstrated by (PEA)$_2$PbI$_4$-containing structures and/or compositions, which is approximately (1-3)×10$^{-3}$ cm$^2$V$^{-1}$s$^{-1}$. In some embodiments of the present disclosure, the out-of-plane charge transport of Me-PDA-containing structures and/or compositions may be between greater than (1-3)×10$^{-3}$ cm$^2$V$^{-1}$s$^{-1}$ and about 1×10$^{-1}$ cm$^2$V$^{-1}$s$^{-1}$ or between greater than (1-3)×10$^{-3}$ cm$^2$V$^{-1}$s$^{-1}$ and about (3-8)×10$^{-2}$ cm$^2$V$^{-1}$s$^{-1}$.

Single crystals of (Me-PDA)Pb$_2$I$_6$ were grown from a concentrated hydroiodic acid solution, as adapted from our previous report, which is incorporated herein by reference in its entirety (X. Chen, H. Lu, Z. Li, Y. Zhai, P. F. Ndione, J. J. Berry, K. Zhu, Y. Yang and M. C. Beard, *ACS Energy Letters*, 2018, 3, 2273-2279). Red, needle-like crystals were collected after a slow-cooling process from about 90° C. to room temperature in an oil bath. Crystallographic data and structure refinement information are shown in Table 1.

TABLE 1

| Crystal data and structure refinement for (Me-PDA)Pb$_2$I$_6$ | |
|---|---|
| Compound Name | (Me-PDA)Pb$_2$I$_6$ |
| Empirical formula | C$_2$H$_7$I$_3$NPb |
| Formula weight | 632.98 |
| Temperature | 250(2) K |
| Wavelength | 0.71073 Å |
| Crystal system | Orthorhombic |
| Space group | Pbam |
| Unit cell dimensions | a = 8.9437(4) Å, α = 90° |
| | b = 17.4542(6) Å, β = 90° |
| | c = 6.4591(3) Å, γ = 90° |
| Volume | 1008.30(7) Å$^3$ |
| Z | 4 |
| Density (calculated) | 4.170 g/cm$^3$ |
| Absorption coefficient | 25.840 mm$^{-1}$ |
| F(000) | 1068 |
| θ range for data collection | 2.334 to 27.538° |
| Index ranges | −11 <= h <= 11, −21 <= k <= 22, −8 <= l <= 8 |
| Reflections collected | 17803 |
| Independent reflections | 1270 [R$_{int}$ = 0.0298] |
| Completeness to θ = 25.242° | 99.7% |
| Refinement method | Full-matrix least-squares on F$^2$ |
| Data/restraints/parameters | 1270/24/51 |
| Goodness-of-fit | 1.051 |
| Final R indices [I > 2σ(I)] | R$_{obs}$ = 0.0182, wR$_{obs}$ = 0.0416 |
| R indices [all data] | R$_{all}$ = 0.0195, wR$_{all}$ = 0.0422 |
| Extinction coefficient | 0.00616(17) |
| Largest diff. peak and hole | 1.046 and −1.017 e · Å$^{-3}$ |

R = Σ||F$_o$| − |F$_c$||/Σ|F$_o$|, wR = {Σ[w(|F$_o$|$^2$ − |F$_c$|$^2$)$^2$]/Σ[w(|F$_o$|$^4$)]}$^{1/2}$ and w = 1/[σ$^2$(Fo$^2$) + (0.0093P)$^2$ + 3.2890P] where P = (Fo$^2$ + 2Fc$^2$)/3

The formation of a "perovskitoid" structure was surprising because a structure more like a conventional Dion-Jacobson 2D perovskite motif was expected. However, the size of Me-PDA$^{2+}$ is near the boundary of forming a stable conventional 3D perovskite and 2D perovskite structure; thus, it permits the crystal to evolve to the perovskitoid structure, which may be viewed as an intermediate phase between the 2D and 3D versions. Thus, based on the size of Me-PDA, in some embodiments of the present disclosure, A' may have a characteristic length between about that of formamidinium (~2.53 Å) and about that of dimethyl propane diammonium (DMe-PDA) (~7.62 Å), or between about that of dimethylammonium (DMA) (~2.72 Å) and about that of Me-PDA (~7.06 Å).

Figure 6:
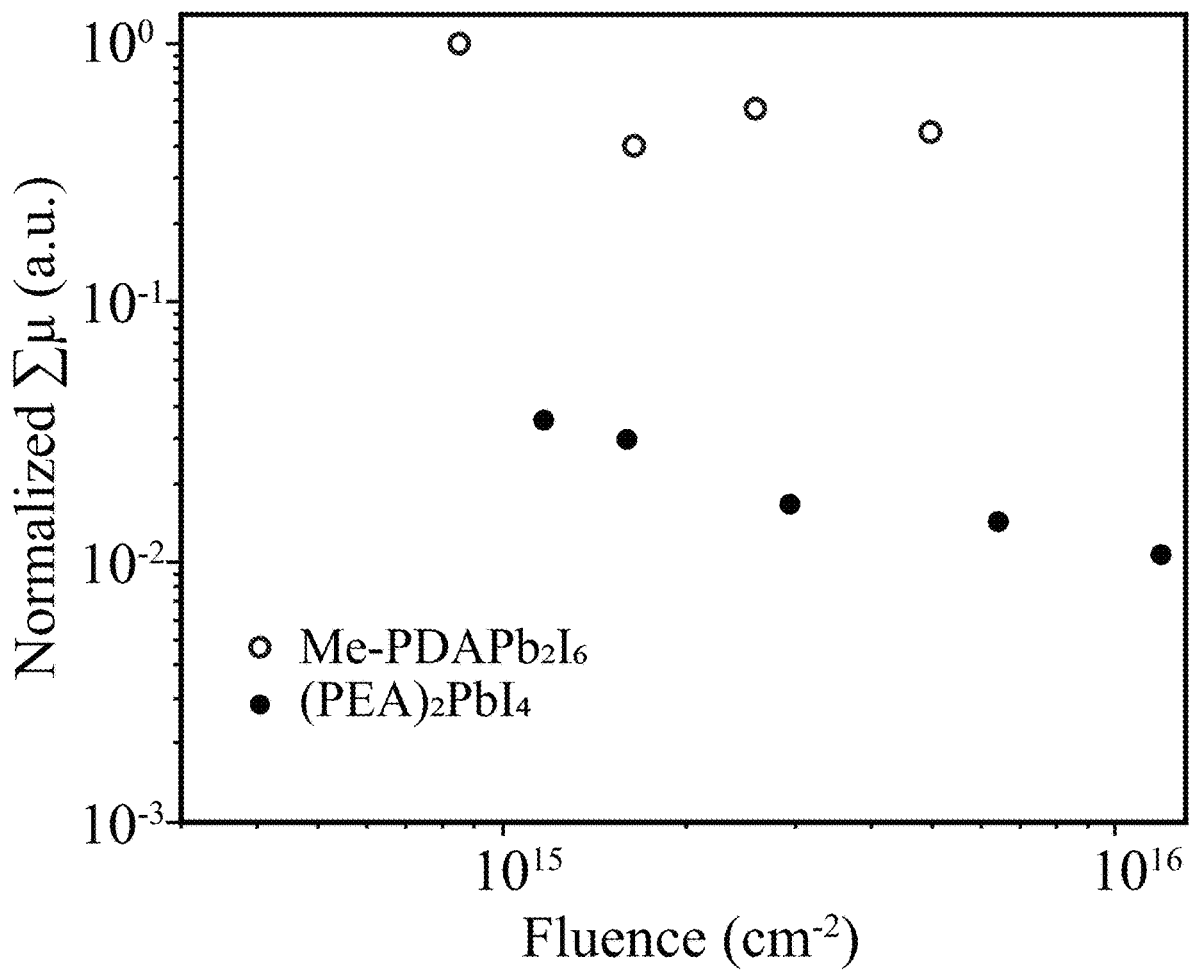
FIG. 6 illustrates a comparation of out-of-plane mobilities in (Me-PDA)$Pb_2I_6$ and (PEA)$_2PbI_4$ layers by time-resolved microwave conductivity (TRMC), according to some embodiments of the present disclosure.

The optical absorption data show that the out-of-plane microwave mobility of (Me-PDA)Pb$_2$I$_6$ is ~28× better than that of (PEA)$_2$PbI$_4$ (see FIG. 6). The out-of-plane mobility is at least 28 time faster for the (Me-PDA)Pb$_2$I$_6$ sample compared to the (PEA)$_2$PbI$_4$ sample. The out-of-plane mobility is an important parameter for structures based on bulky organic cations such as 2D perovskites. These materials provide protection for higher stability against moisture and heat and ion migration, etc. But since they often grow with the 2D sheets parallel to the underlying materials (e.g., 3D perovskite), charge transport across the 2D sheets (or the out-of-plane transport) is very important. Perovskitoids can be viewed as 3D structures. Although there are still bulky organic cations (which provide those benefits of increasing stability), the two adjacent inorganic sheets are no longer completely separated by bulky-organic-cation layers. There are direct connection points between adjacent inorganic sheets. Thus, the charge transport vertical to the inorganic sheets is much improved than the regular 2D perovskite structures as illustrated in FIG. 3.

Figure 7:
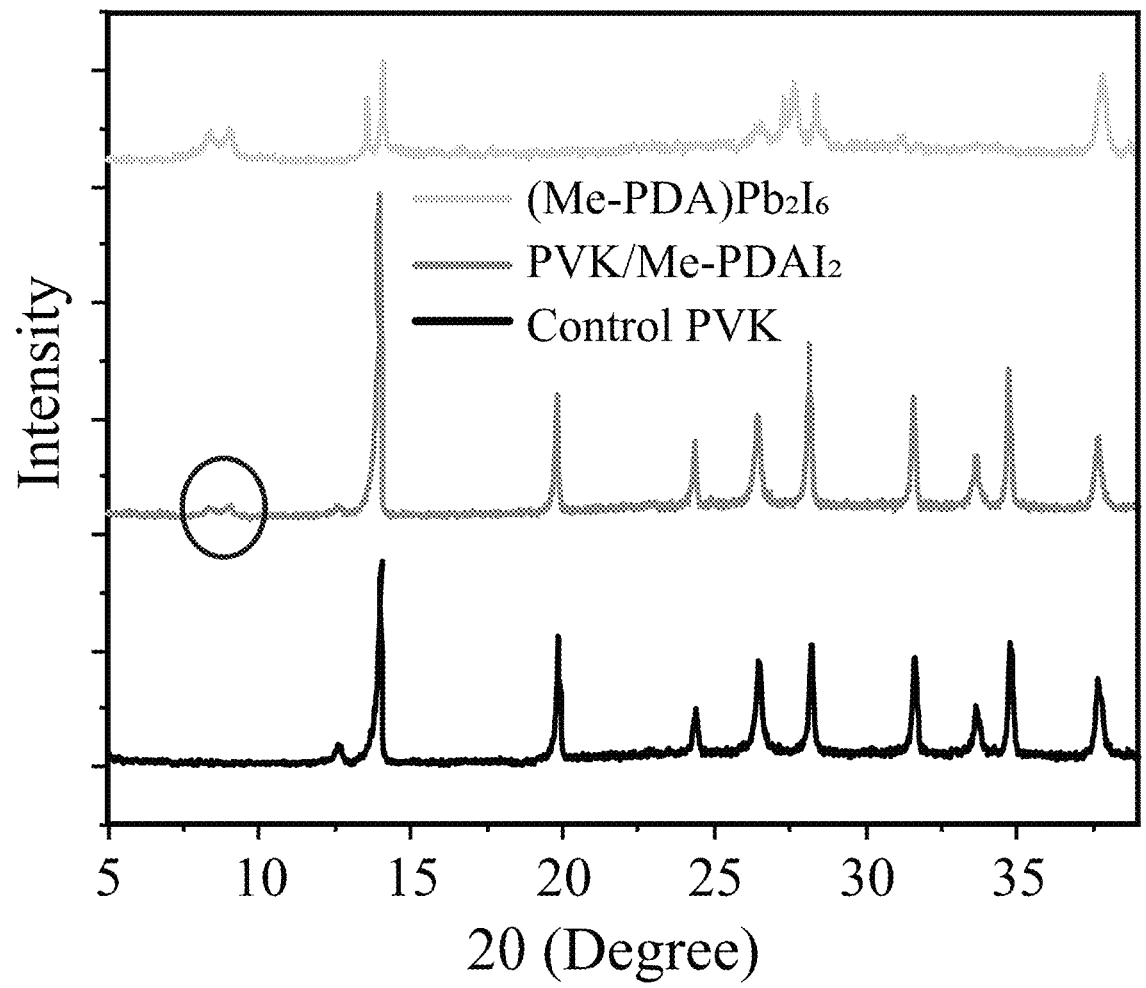
FIG. 7 illustrates a comparison of XRD patterns of (Me-PDA)$Pb_2I_6$ perovskitoid layers and $(FAPbI_3)_{0.85}(MAPbI_2Br)_{0.10}(CsPbI_3)_{0.05}$ perovskite layers without (Control PVK) and with Me-PDAI$_2$ treatment (PVK/Me-PDAI), according to some embodiments of the present disclosure.
Figure 8:
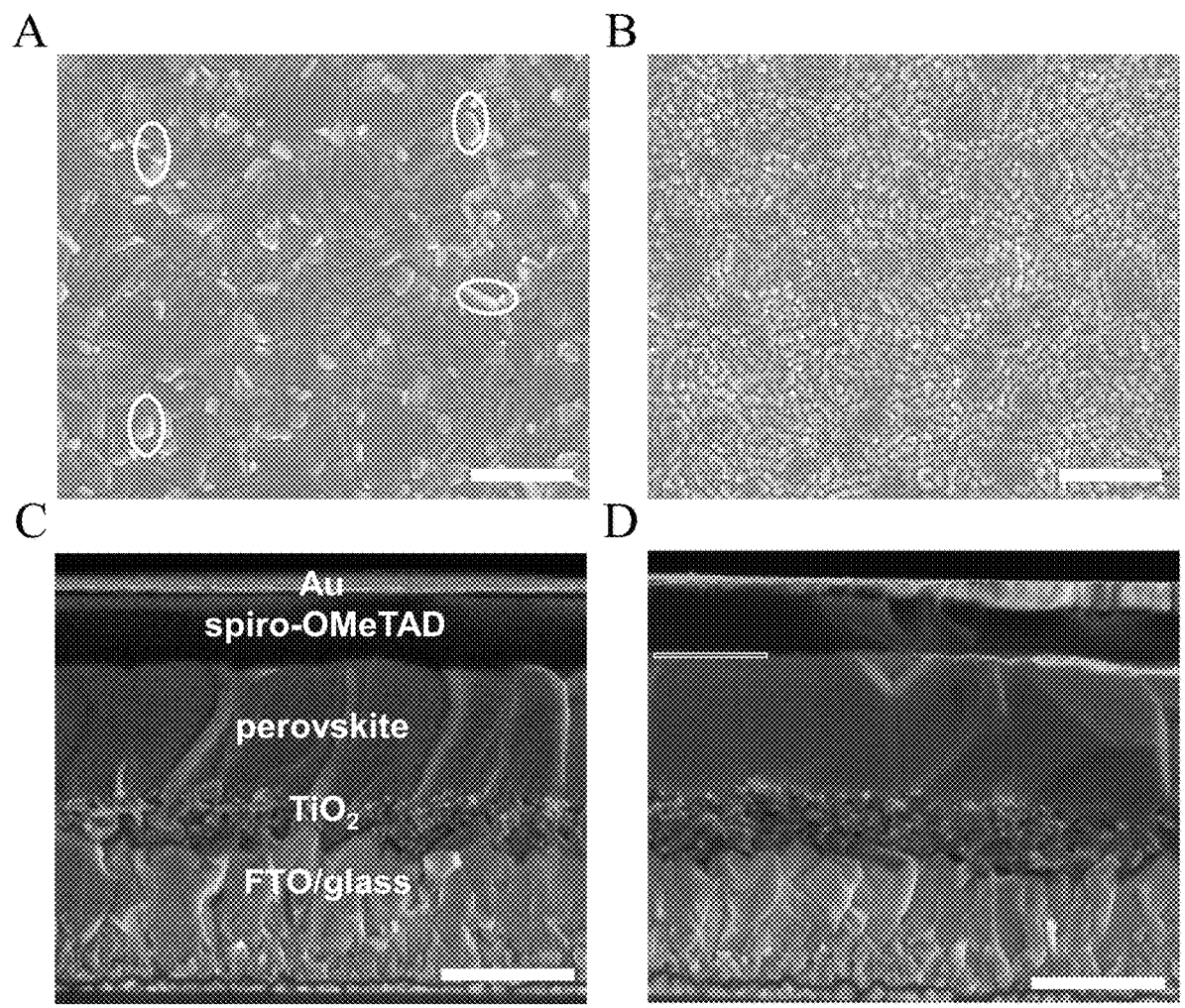
FIG. 8 illustrates top-view scanning electron microscopy (SEM) images of the control perovskite in Panel A and of perovskite/Me-PDAI$_2$ layers in Panel B (scale bar: 1 μm), according to some embodiments of the present disclosure. Cross-sectional SEM images are shown of the control perovskite in Panel C and perovskite/Me-PDAI$_2$ devices in Panel D (scale bar: 500 nm). The cell architecture from top to bottom is Au/spiro-OMeTAD/perovskite/mesoporous-TiO$_2$/compact-TiO$_2$/FTO/glass. The white line in the upper left corner of Panel D indicates a capping layer.
Figure 9A:
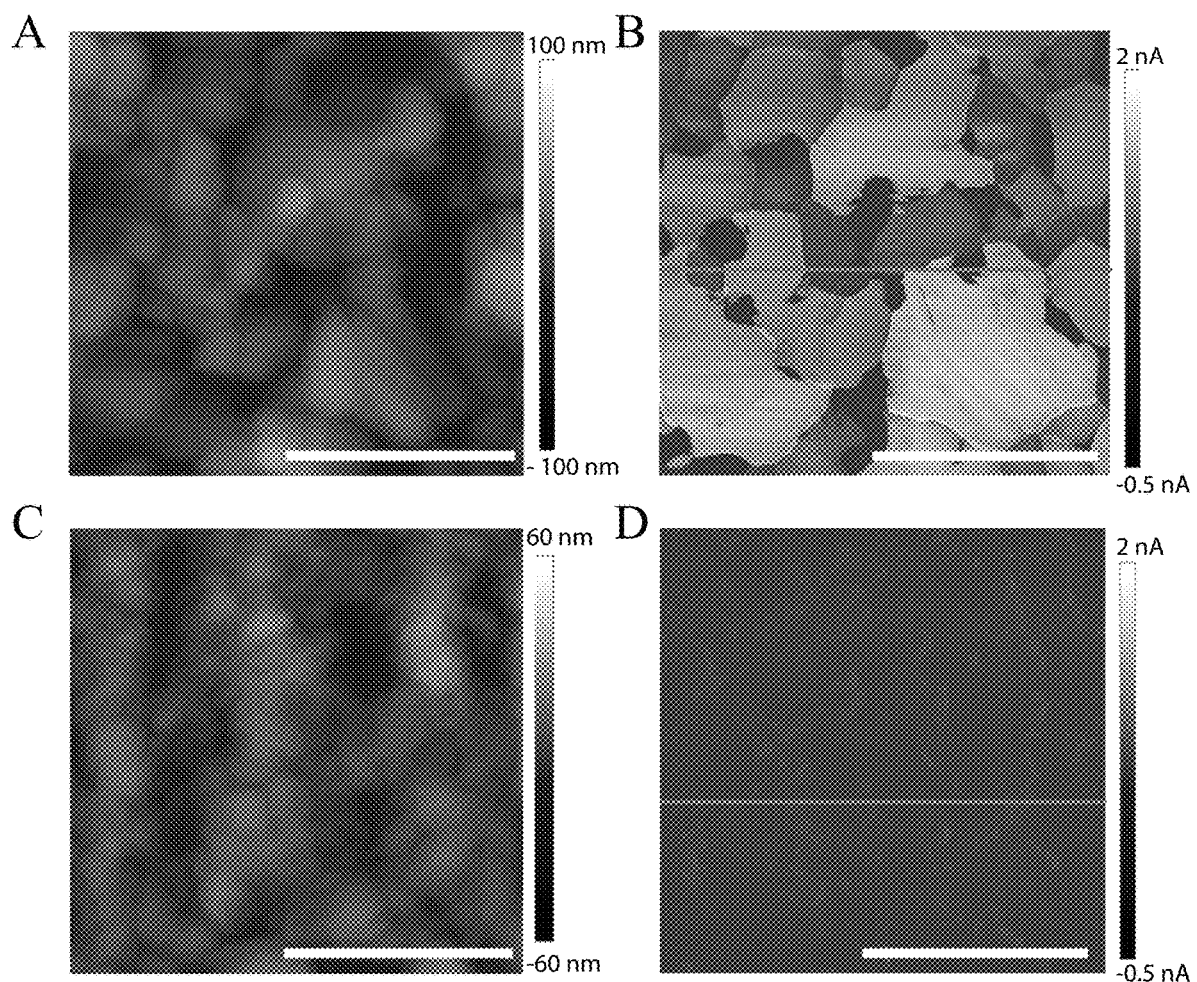
FIG. 9A illustrates AFM topography of the control, in Panel A, and Me-PDAI$_2$-treated perovskite layers on TiO$_2$/FTO glass, in Panel C (scale bar: 1 µm), according to some embodiments of the present disclosure. The C-AFM images of the control and Me-PDAI$_2$-treated perovskite layers on TiO$_2$/FTO glass (scale bar: 1 µm) are shown in Panels B and D, respectively, according to some embodiments of the present disclosure.
Figure 10:
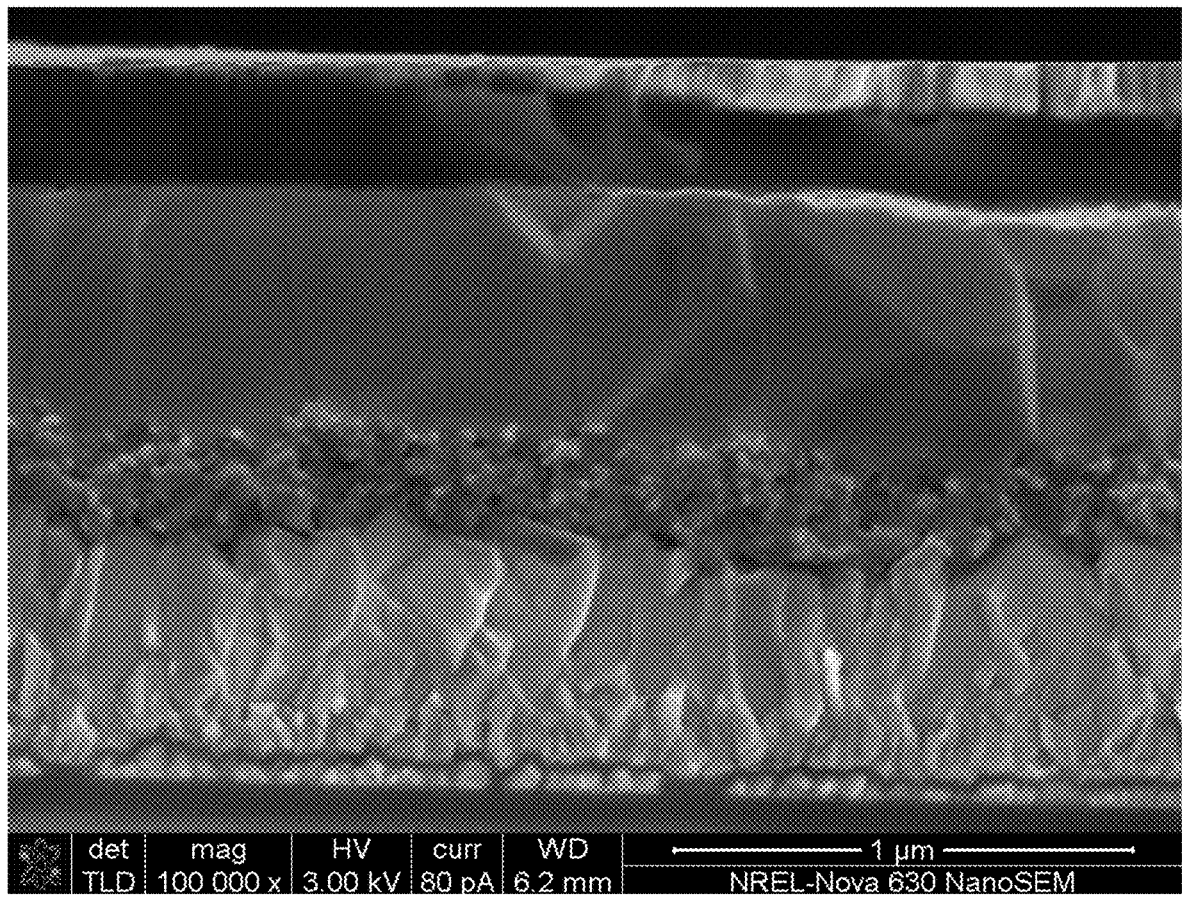
FIG. 10 illustrates a cross-sectional SEM image of a PVK/Me-PDAI$_2$ device, according to some embodiments of the present disclosure.

Me-PDAI$_2$ was applied by spin-coating from an IPA/Me-PDAI$_2$ solution on top of a 3D (FAPbI$_3$)$_{0.85}$(MAPbI$_2$Br)$_{0.10}$(CsPbI$_3$)$_{0.05}$ perovskite layer, followed by annealing at 100° C. for about 2 minutes (see FIG. 7). The surface morphology of the control and Me-PDAI$_2$-treated perovskite layers were characterized by scanning electron microscopy (SEM), and the results are shown in Panels A and B of FIG. 8. The control perovskite film showed a compact and pinhole-free morphology with appearance of some bright PbI$_2$ components. After the Me-PDAI$_2$ treatment, the surface of the starting perovskite layer undergoes a reaction to form the perovskitoid (Me-PDA)Pb$_2$I$_6$ structure with apparently smaller surface morphological features. The resultant 3D perovskitoid (Me-PDA)Pb$_2$I$_6$ layer (i.e., second layer) appears to uniformly cover the entire underlying perovskite (i.e., first layer), which is further confirmed by atomic force microscopy (AFM) (see Panels A and C of FIG. 9A). In addition, the root-mean-square (RMS) roughness of the surface of the resultant two-layer composition has been decreased from 21 nm to 16 nm after the Me-PDAI$_2$ treatment, which is expected to improve the contact of the perovskite layer with the hole-transport layer (HTL) for charge transfer. Panels C and D of FIG. 8 and FIG. 10 clearly show that the Me-PDAI$_2$-treated perovskite layers form a very thin capping layer (i.e., second layer 420) on top of the 3D perovskite layer (i.e., first layer 410) when compared to the control perovskite devices. In addition, the conductive-AFM (C-AFM) measurements show that the current of the perovskitoid-coated perovskite layer is much more uniform and significantly lower than the control perovskite layer, which is consistent with the formation of a capping layer (i.e., second layer) (see Panels B and D of FIG. 9A).

Although, the examples described herein utilize spiro-OMeTAD as a hole-transport material, this is for illustrative purposes only. Other HTMs that may be suitable for PSC devices include at least one of poly[bis(4-phenyl)(2,4,6-trimethylphenyl)amine (PTAA), poly(N,N'-bis-4-butylphenyl-N,N'-bisphenyl)benzidine (Poly-TPD), and nickel oxide (NiO), and/or a suitable self-assembling monolayer such as at least one of [2-(3,6-dimethoxy-9H-carbazol-9-yl)ethyl] phosphonic acid (MeO-2PACZ), ([4-(3,6-dimethyl-9H-carbazol-9-yl)butyl]phosphonic Acid) (Me-4PACZ), (4-(4-(3,6-dimethoxy-9H-carbazol-9yl)butyl)phosphonic acid (MeQ-4PACZ), and/or ([2-(9H-carbazol-9-yl)ethyl]phosphonic acid (2PACZ).

To investigate the effect of Me-PDAI$_2$ modification on structural change, XRD measurements of the corresponding perovskite layers coated on TiO$_2$/glass substrates were performed (see FIG. 7). The perovskite treated with Me-PDAI$_2$ and the control perovskite layers exhibit the same main diffraction peaks, indicating that the Me-PDAI$_2$ modification did not change the primary lattice structure of the perovskite layers. However, some differences exist. In the control perovskite layer, excess PbI$_2$ is indicated by the diffraction peak at 12.6°. When Me-PDAI$_2$ modification was employed, the diffraction of the PbI$_2$ phase was reduced, which is also consistent with the SEM results, whereas a conspicuous peak<10° emerged, corresponding to the formation of the (Me-PDA)Pb$_2$I$_6$ perovskitoid structure.

Figure 9B:
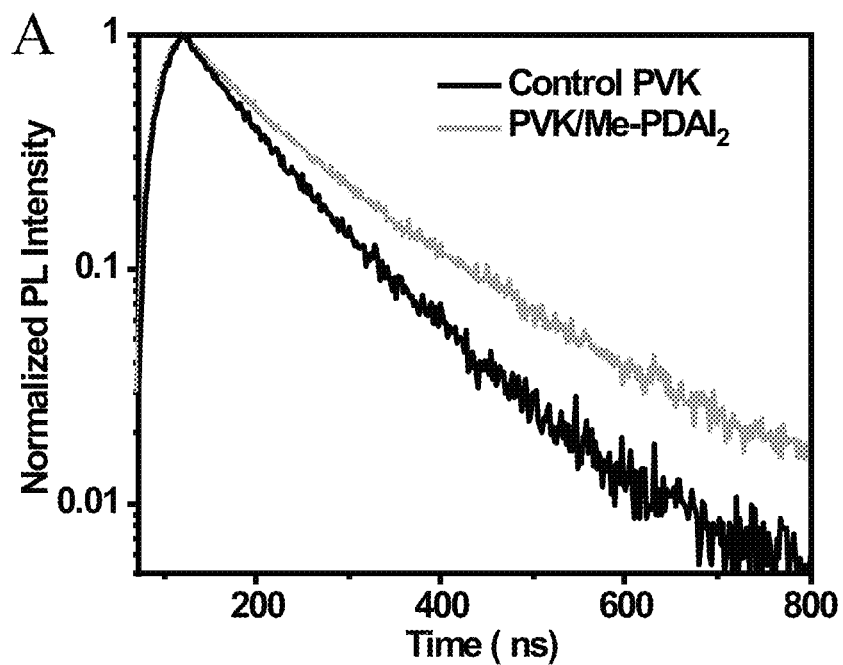
FIG. 9B illustrates time-resolved photoluminescence measurements (Panel A) and time-resolved microwave conductivity measurements (Panel B) corresponding to the layers illustrated in FIG. 9A, according to some embodiments of the present disclosure.
Figure 9B:
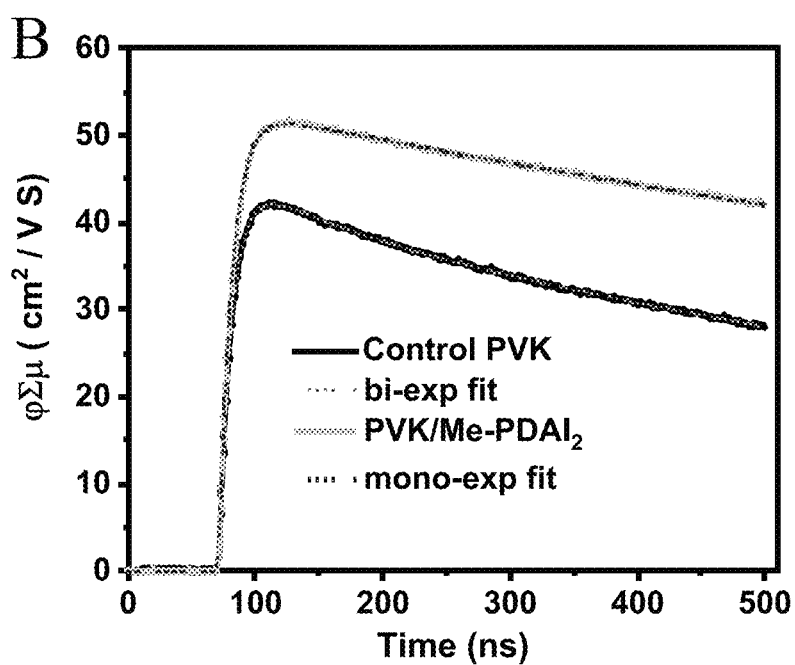
Figure 11:
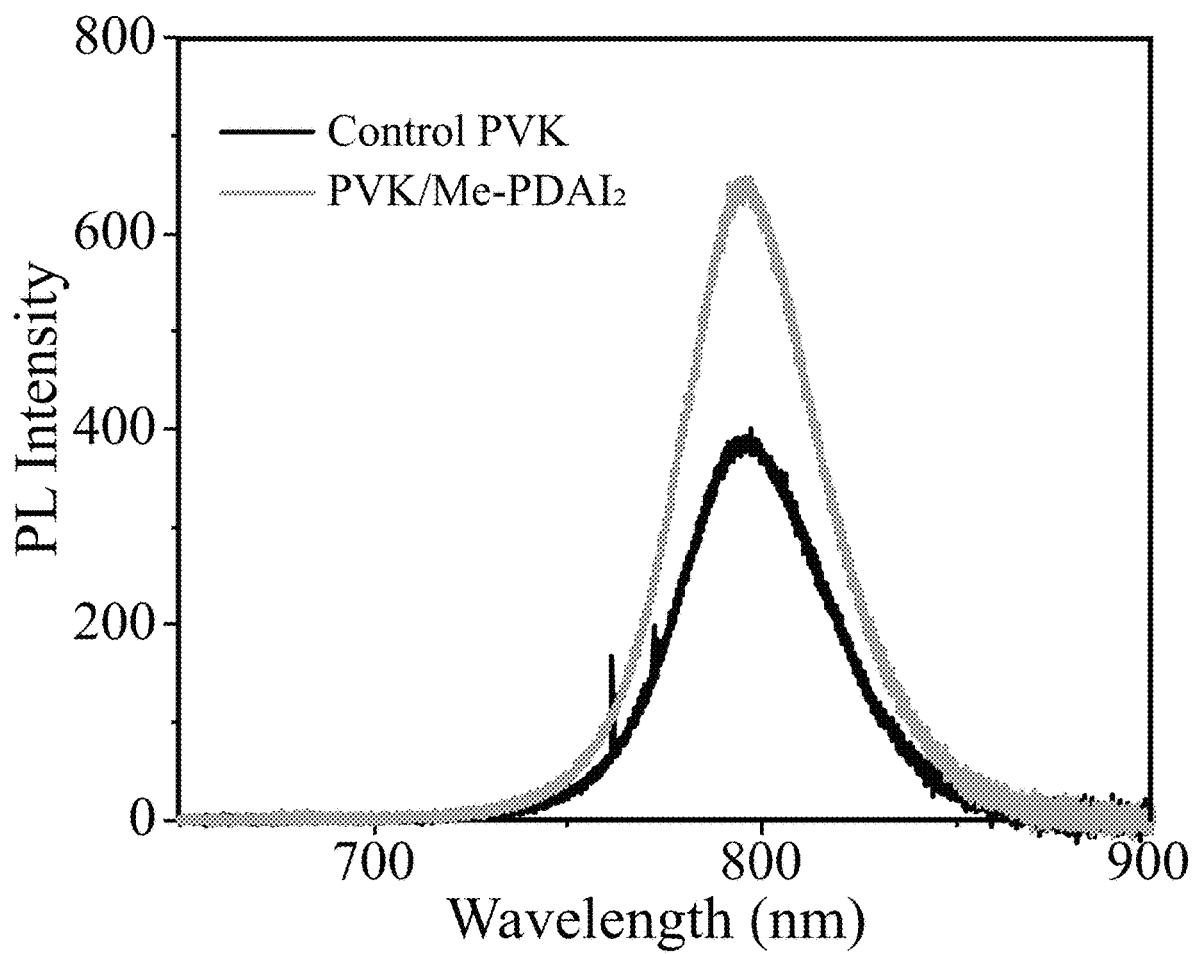
FIG. 11 illustrates PL spectra measured of control perovskite layer and Me-PDAI$_2$-treated perovskite layers, according to some embodiments of the present disclosure.

To gain more insight on how the Me-PDAI$_2$ modification affects the optoelectronic properties in perovskite layers, steady-state photoluminescence (PL), time-resolved photoluminescence (TRPL) and microwave conductivity (TRMC) studies of these samples were conducted. It was determined that the PL intensity (see FIG. 11) is obviously increased after Me-PDAI$_2$ modification, indicating largely suppressed surface recombination. Panel A of FIG. 9B displays the TRPL kinetics of the corresponding perovskite layers, and the lifetimes are extracted by modeling with a bi-exponential decay function (see Table 2). The Me-PDAI$_2$-treated layers exhibit longer lifetimes than the control layer. The improved lifetime is consistent with surface-defect passivation and improved device performance, especially for the increased fill factor (FF) and open-circuit voltage ($V_{oc}$). TRMC transient photoconductivity decay data are presented in Panel B of FIG. 9B. The control perovskite has a bi-exponential-fitted average lifetime of 1.00 microseconds, weighted by 9.7% from an early fast-decay time component of 83 ns and the 90.3% from a later slow-decay time component of just over 1.1 microseconds. In the case of MePDAI$_2$ treatment, the data could not be fitted with a bi-exponential, indicating that the contribution from the early fast-decay time component was eliminated. Instead, the single time-component-fitted lifetime is about 1.8 microseconds. The early timescale decay may be due to trapping and recombination of charges near the surface region. After surface treatment with MePDAI$_2$ to form a perovskitoid layer, surface recombination is suppressed, and carriers are longer lived. The treatment also leads to higher mobility. The fit-extracted t=0 yield-mobility product ($\varphi\Sigma\mu$) is 45.3 cm$^2$/Vs for the control and 52.8 cm$^2$/Vs for the MePDAI$_2$ treatment. The yield is normally close to unity in high-performance PSCs, so the yield-mobility product can be viewed as a measurement of the charge mobility. The improved free-carrier mobility and lifetime further support the benefit provided by the (Me-PDA)Pb$_2$I$_6$ perovskitoid surface layer to the perovskite layer quality.

TABLE 2

Lifetimes extracted by fitting the PL decay curve with a bi-exponential decay function

| Samples | Fast Component $t_1$ (ns) | Slow Component $t_2$ (ns) |
| --- | --- | --- |
| Control PVK | 62 | 127 |
| PVK/Me-PDAI$_2$ | 76 | 197 |

Figure 12A:
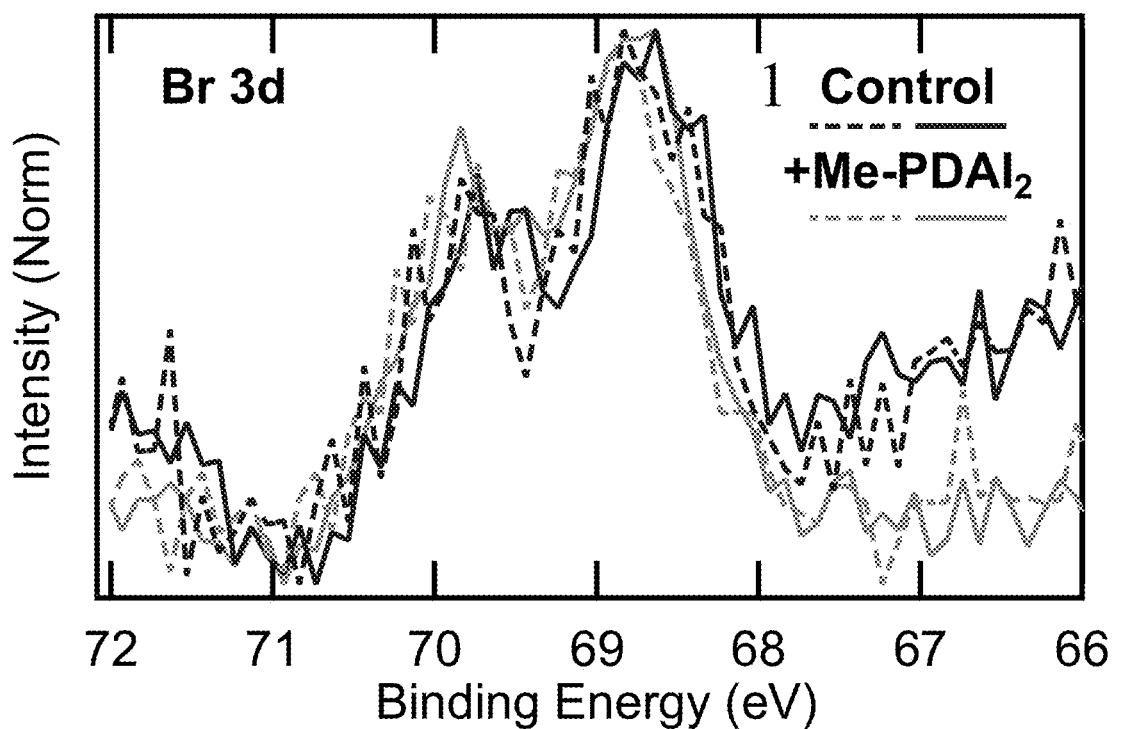
FIGS. 12A, 12B, and 12C illustrate The XPS spectra taken on two different spots based on control and Me-PDAI$_2$-treated perovskite layers, according to some embodiments of the present disclosure.
Figure 12A:
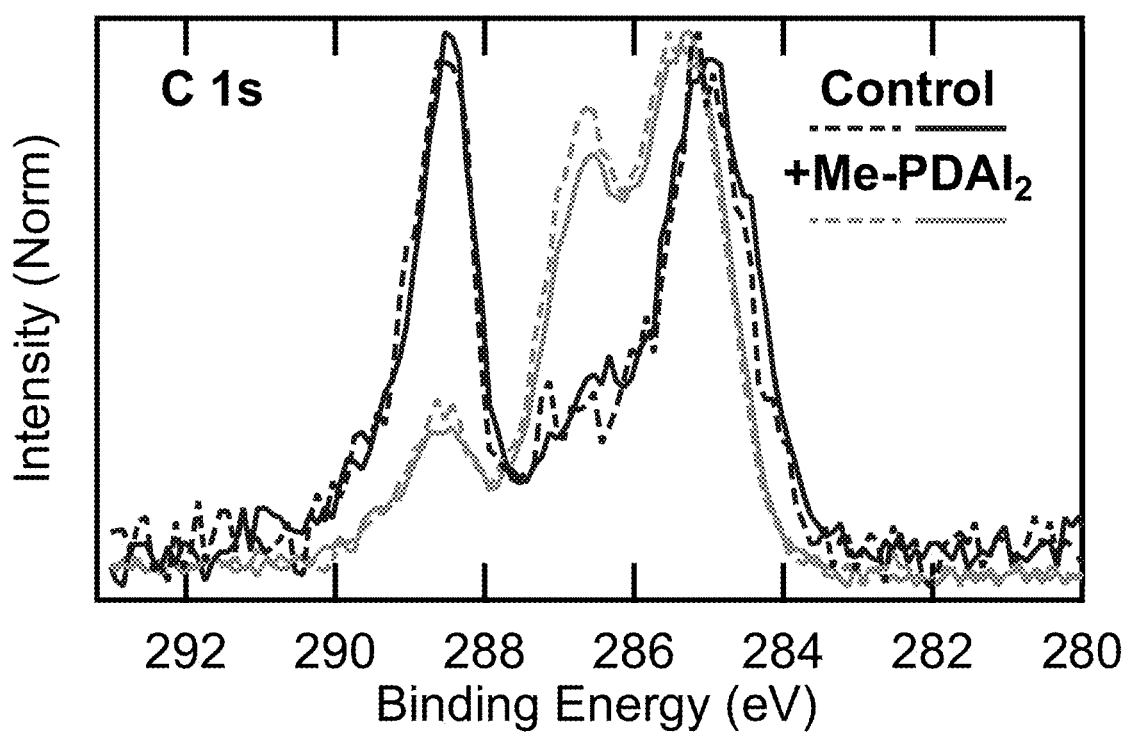
Figure 12B:
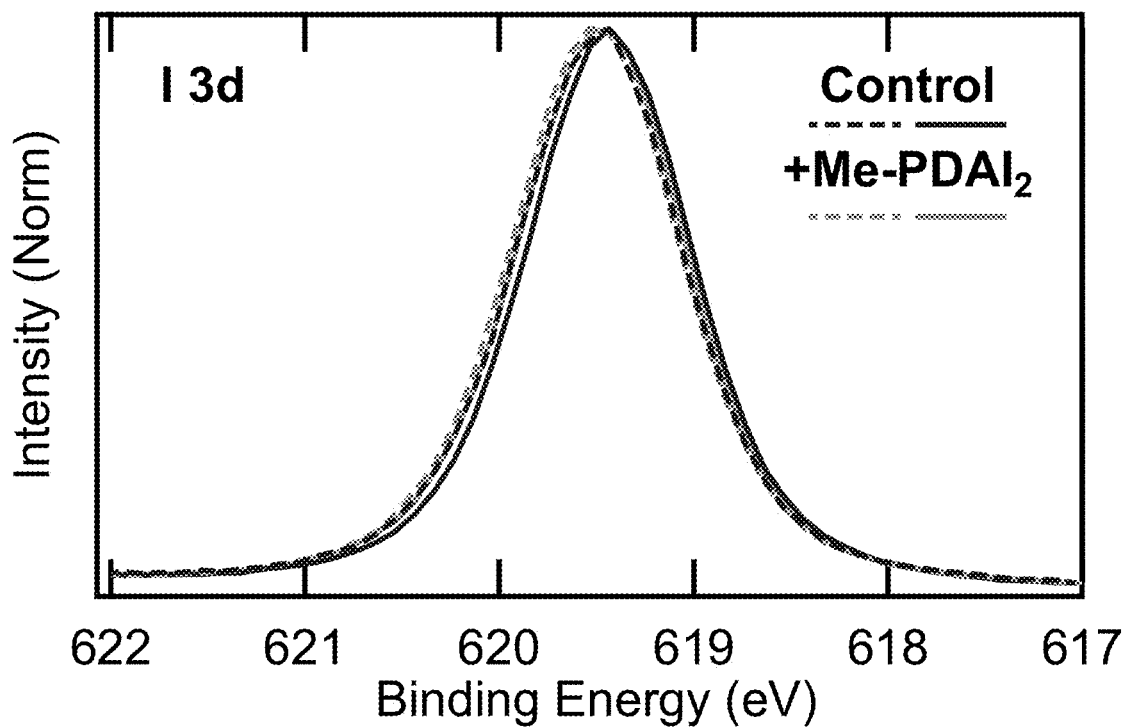
Figure 12B:
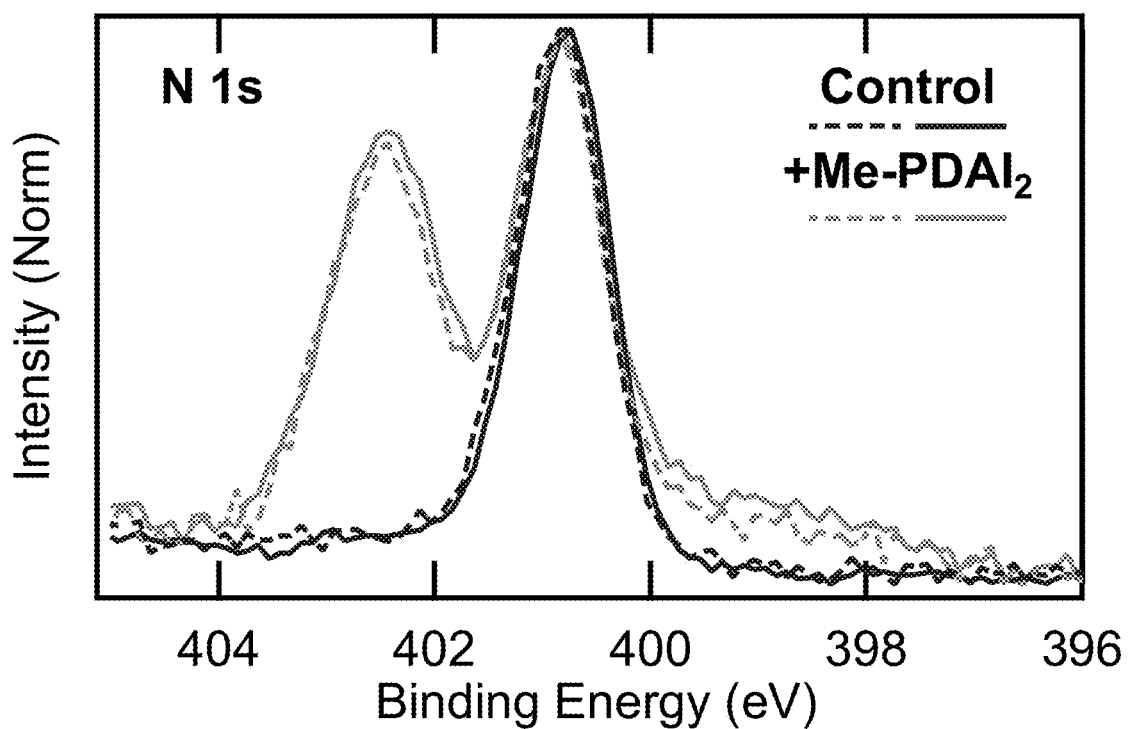
Figure 12C:
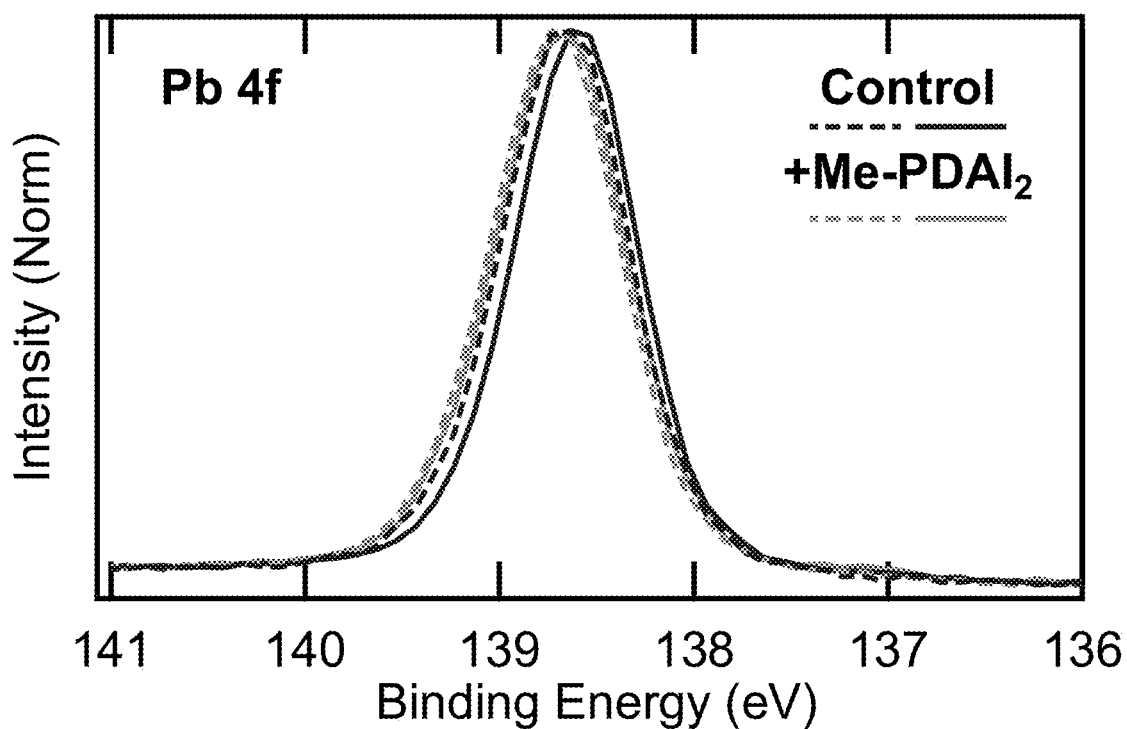
Figure 12C:
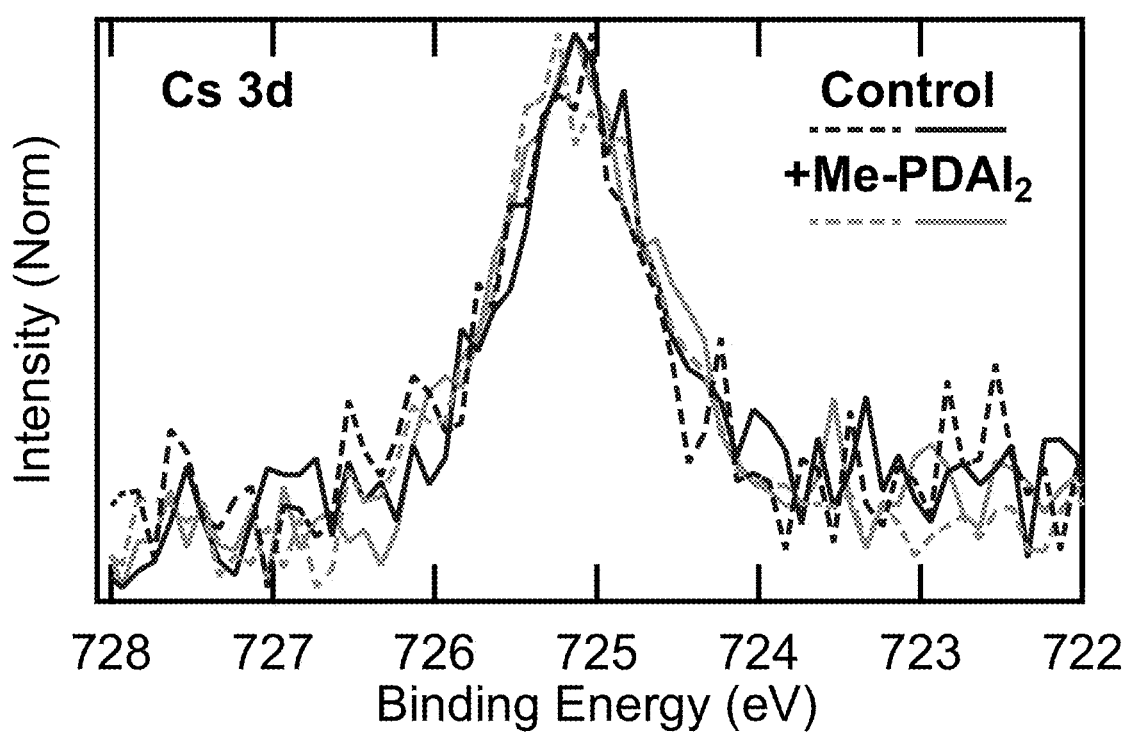
Figure 13A:
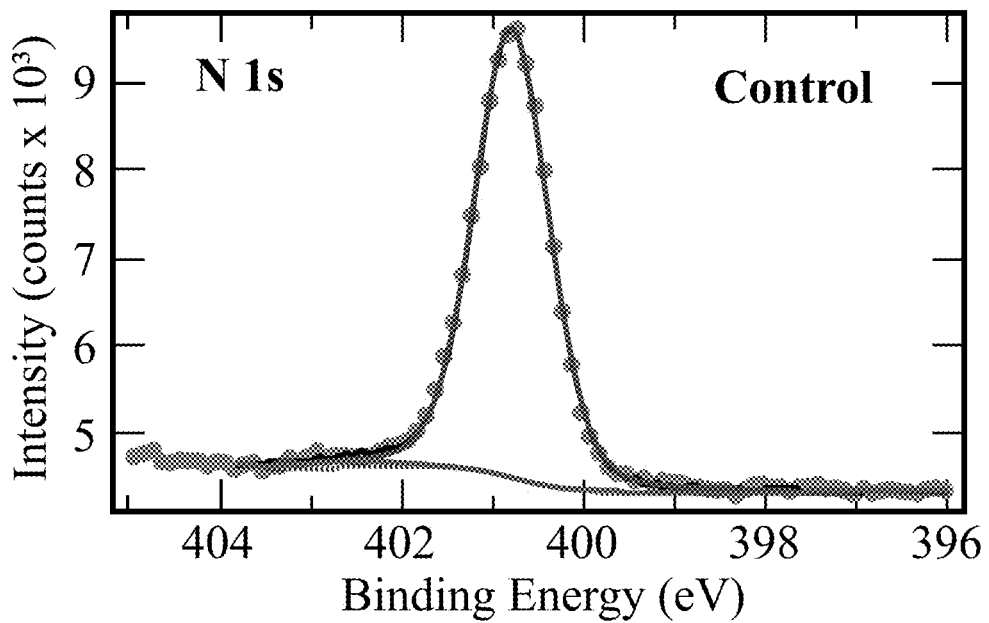
FIGS. 13A and 13B illustrate a comparison of the XPS spectra of N1s and C1s of the control and Me-PDAI$_2$-treated perovskite layers, respectively, according to some embodiments of the present disclosure.
Figure 13A:
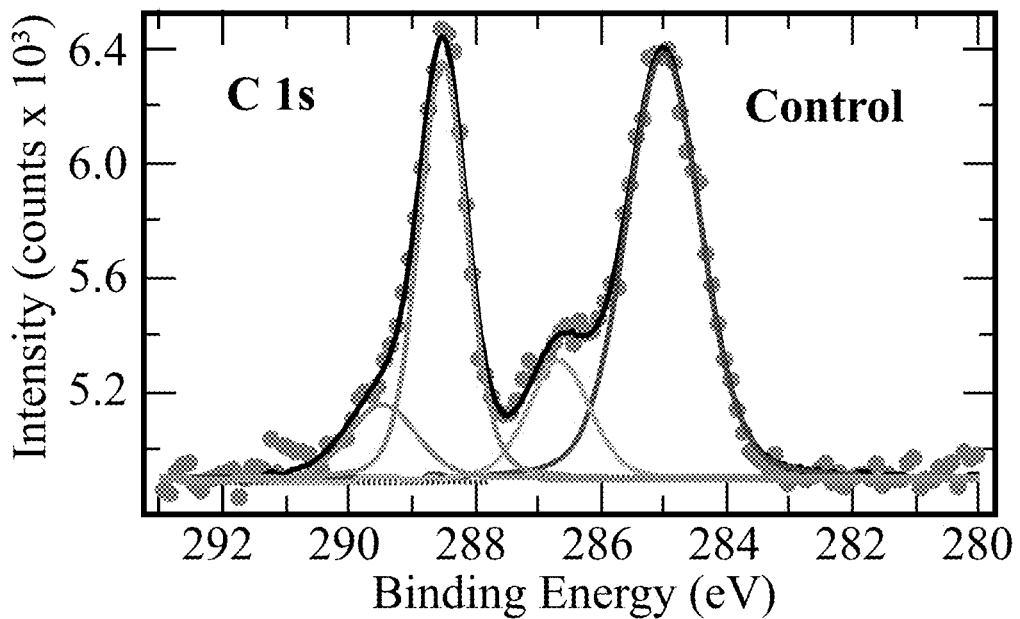
Figure 13B:
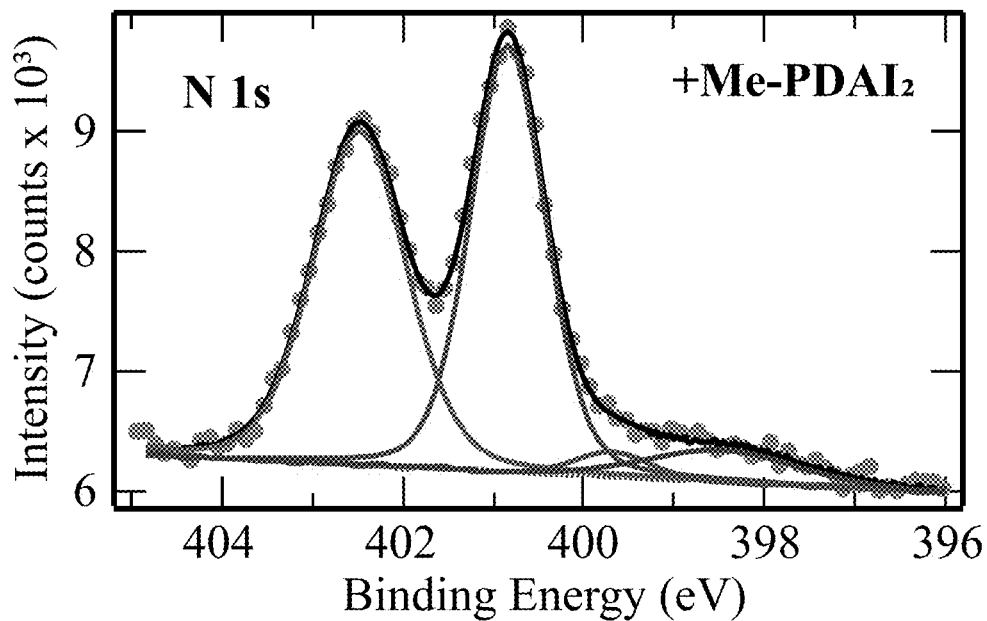
Figure 13B:
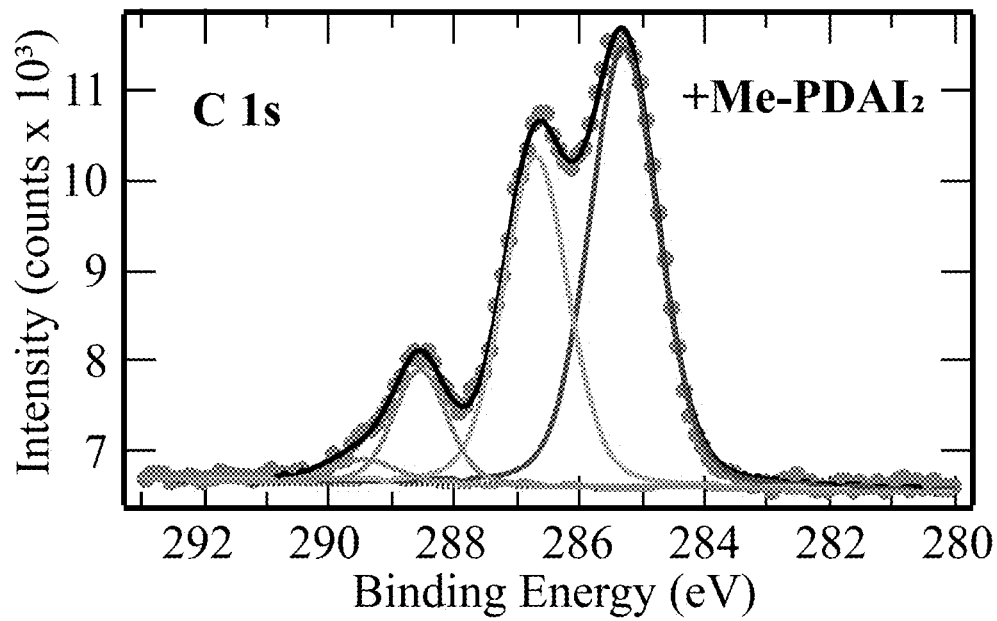

To further characterize the effect of the Me-PDAI$_2$ treatment on the surface chemistry of the layers, X-ray photoelectron spectroscopy (XPS) was performed on the treated and untreated perovskite layers deposited on the FTO/TiO$_2$ substrates. Results, taken on two different spots for each sample, are shown in FIGS. 12A, 12B, and 12C. The samples appear to be uniform, with minimal fluctuations from spot to spot; there also appears to be relatively small differences in the core-level spectra other than those attributed to the surface modifier (C and N). The large differences seen in the N 1s and C 1s core levels (displayed averaged and fit in FIGS. 13A and 13B) clearly indicate a capping layer. Specifically, the N1s signal from the untreated perovskite layer is predominately made up of a single peak at ~401-eV binding energy that can be attributed to the C=NH$_2^+$ bonds of the FA cation, with an extremely small shoulder at ~402.5 eV that comes from the C—NH$_3$ bonds of the MA cation. Upon surface treatment using Me-PDAI$_2$, we see a large increase in the peak attributed to the C—NH$_3$ bonds, along with the emergence of two peaks at lower binding energy. The higher binding energy of these peaks may be due to a C—NH$_2$ bond resulting from deprotonation of the terminal ammonium group on one side of the molecule and the lower binding energy peak to the C—NH$_2$—CH$_3$ bond present on the other side of the molecule that is terminated by the methyl group.

A redistribution of the C—C, N—CH$_3$, HC(NH$_2$)$_2$, and C—O/C=O peaks in the C1s spectra (listed from low to high binding energy) also results from the Me-PDAI$^2$ treatment. Specifically, a large reduction is observed in the relative intensity of the HC(NH$_2$)$_2$ peak ascribed to termination with the FA cation, along with a large increase to the C—C and N—CH$_3$ peaks that are present from in the Me-PDAI$_2$ treatment.

Figure 14:
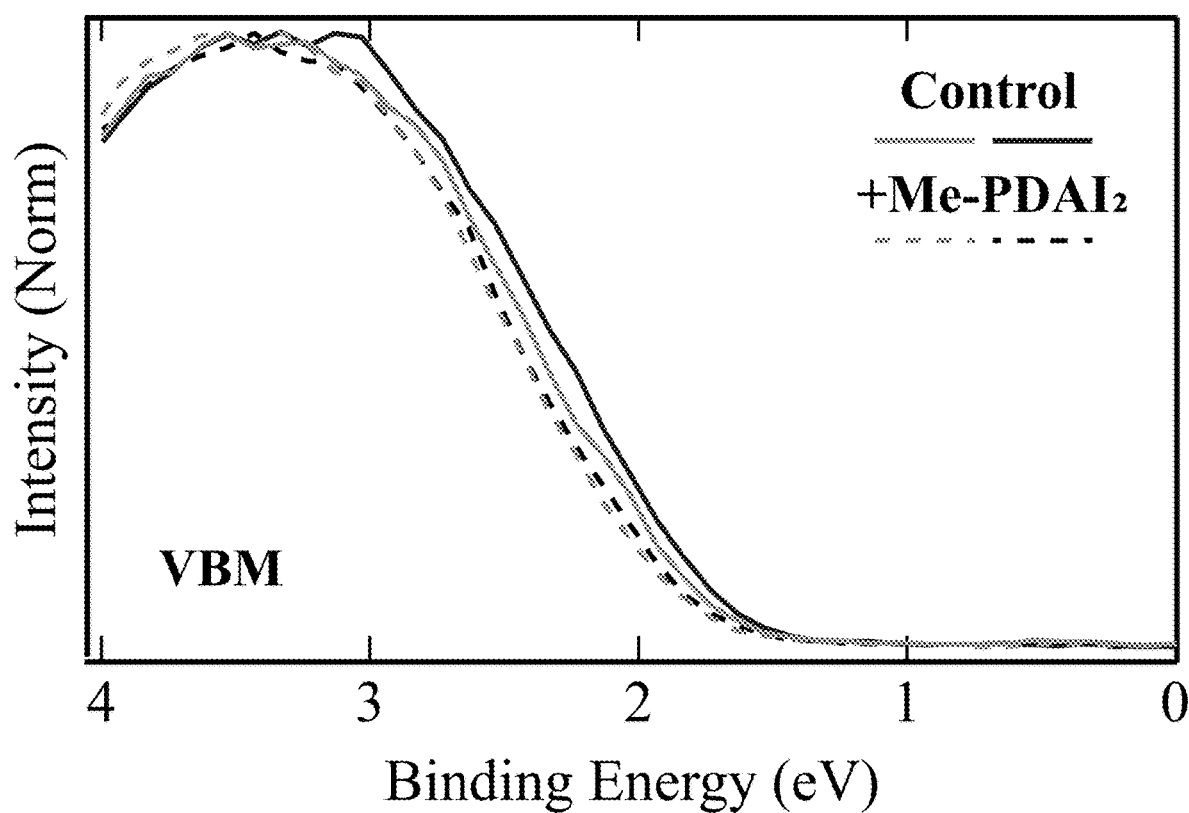
FIG. 14 illustrates UPS spectra taken on two different spots based on a control perovskite layer and Me-PDAI$_2$-treated perovskite layers, according to some embodiments of the present disclosure.
Figure 15:
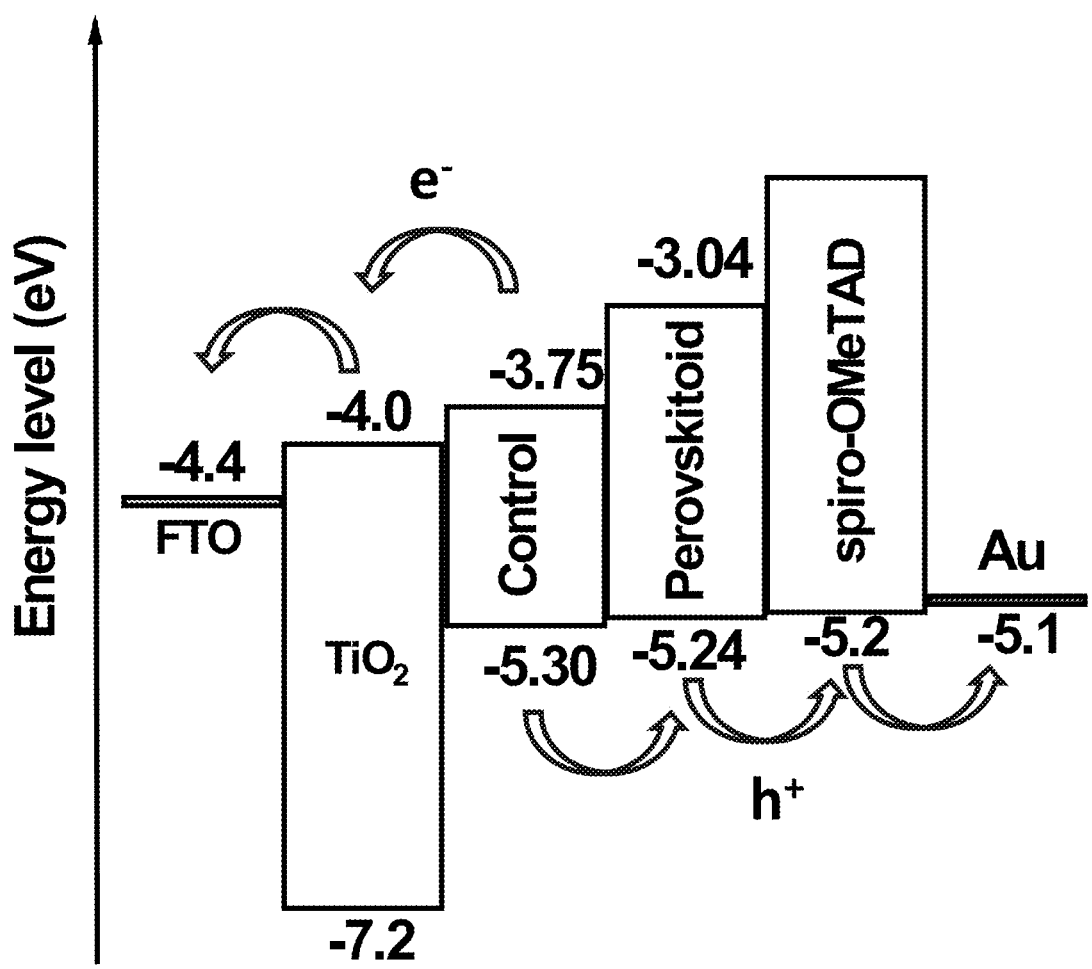
FIG. 15 illustrates an energy band diagram of the devices using a perovskite absorber layer covered with a perovskitoid layer, according to some embodiments of the present disclosure.

This change in the C and N environments correlates well with a large increase in the I:Pb, N:Pb, and C:Pb ratios, indicating a surface richer in both organic and halide species (see Tables 3 and 4). Together, XPS results suggest that the post-treatment creates a thin capping layer on the perovskite surface, which is consistent with the formation of a perovskitoid surface layer on top of the underlying perovskite layer, as discussed above. This perovskitoid surface layer is rich in both organic and halide species and therefore likely reduces the number of undercoordinated Pb sites/iodide vacancies, which are known to create downward band-bending at the surface. Thus, treating the perovskite surface such that it is no longer undercoordinated in lead (which we can see in the organic and halide to lead ratios) is expected to remove these defect states, flattening the bands at the interface between the perovskite and the HTL. This should be beneficial for device performance because as downward bent bands (moving from perovskite bulk to perovskite/HTL interface) will create a driving force for electron injection into the HTL. In addition, UPS/XPS (see FIG. 14) was used to study the work function (WF) and valence band (VB). The results are summarized in Table 5. We further show a schematic energy band diagram based on these results, as shown FIG. 15. It was determined that after the Me-PDAI$_2$ treatment, the formed capping layer is beneficial for hole transport. In addition, it also functions as an electron blocking layer in the PSCs, leading to the reduction of interfacial recombination.

TABLE 3

The constrained fitting procedure (from low binding energy to high) used by deconvoluted C1s peak

| Peak # | Binding Energy Location | Full Width at Half Maximum |
| --- | --- | --- |
| C1 | −1.7 to −1.4 | 1.3-1.4 |
| C2 | NA | 1.15-1.25 |
| C3 | +1.75 to +1.85 | 0.9-1.1 |
| C4 | +2.75 to +2.85 | 1.25-1.35 |

TABLE 4

The constrained fitting procedure (from low binding energy to high) used by deconvoluted N1s peak

| Peak # | Binding Energy Location | Full Width at Half Maximum |
| --- | --- | --- |
| N1 | −2.35 to −2.25 | 1.8-2.0 |
| N2 | −1.2 to −1.1 | 0.8-1.0 |
| N3 | NA | 0.95-1.0 |
| N4 | +1.6 to +1.8 | 1.15-1.25 |

TABLE 5

Summary of energy levels determined from UPS/XPS measurements. Bandgaps of 1.55 eV and 2.20 eV were used to determine the conduction band of control perovskite and perovskitoid, respectively

| Samples | Conduction Band (eV) | Work Function (eV) | Valence Band (eV) |
| --- | --- | --- | --- |
| Control perovskite | 3.75 | 4.16 | 5.30 |
| Perovskitoid | 3.04 | 4.18 | 5.24 |

Figure 16A:
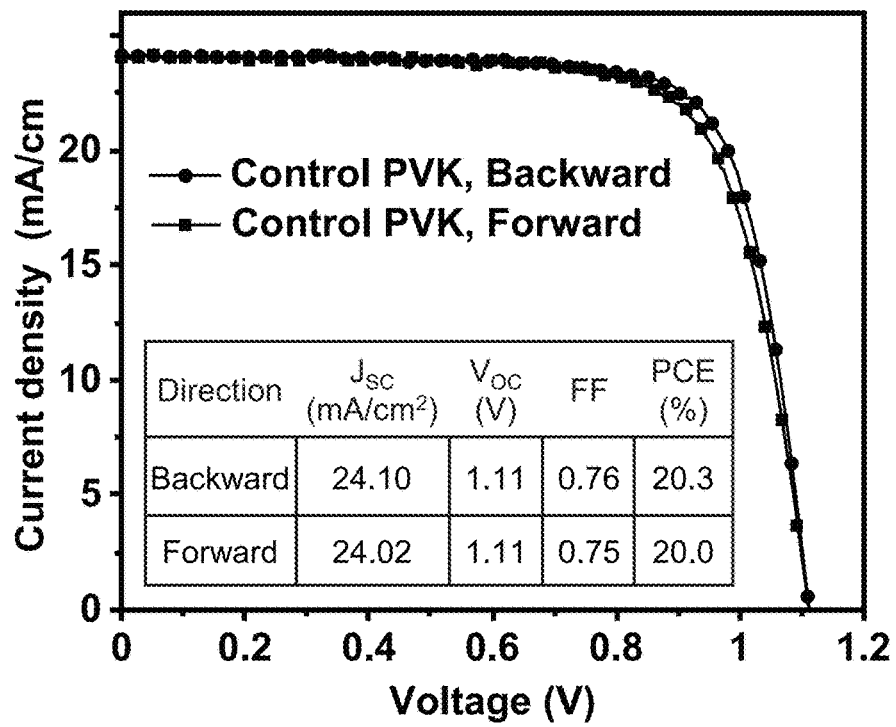
FIG. 16A illustrates J-V curves of PSCs based on the (Panel A) control and (Panel B) Me-PDAI$_2$-treated perovskite layers, according to some embodiments of the present disclosure.
Figure 16A:
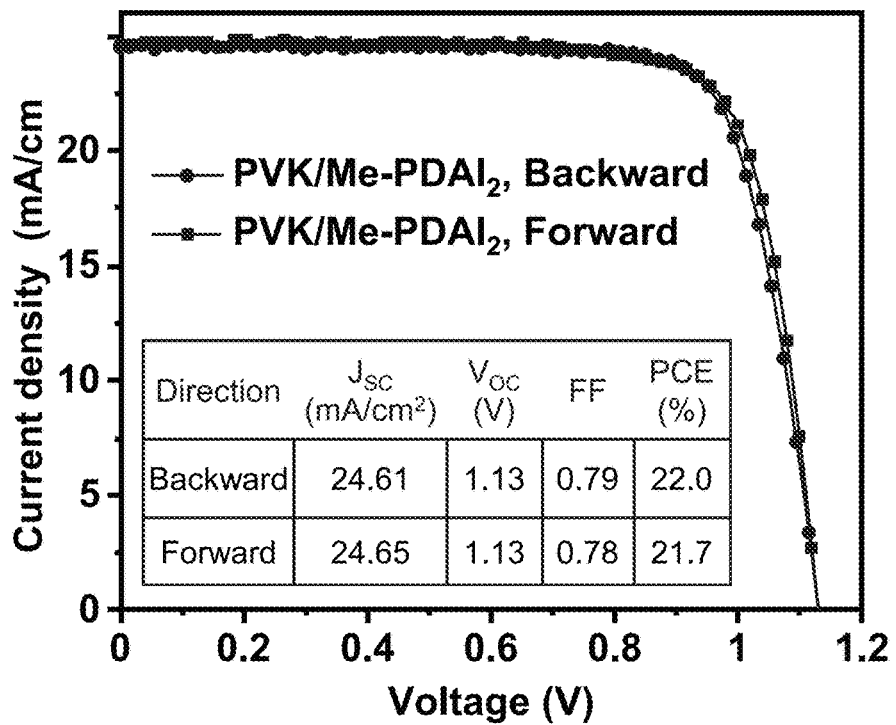
Figure 16B:
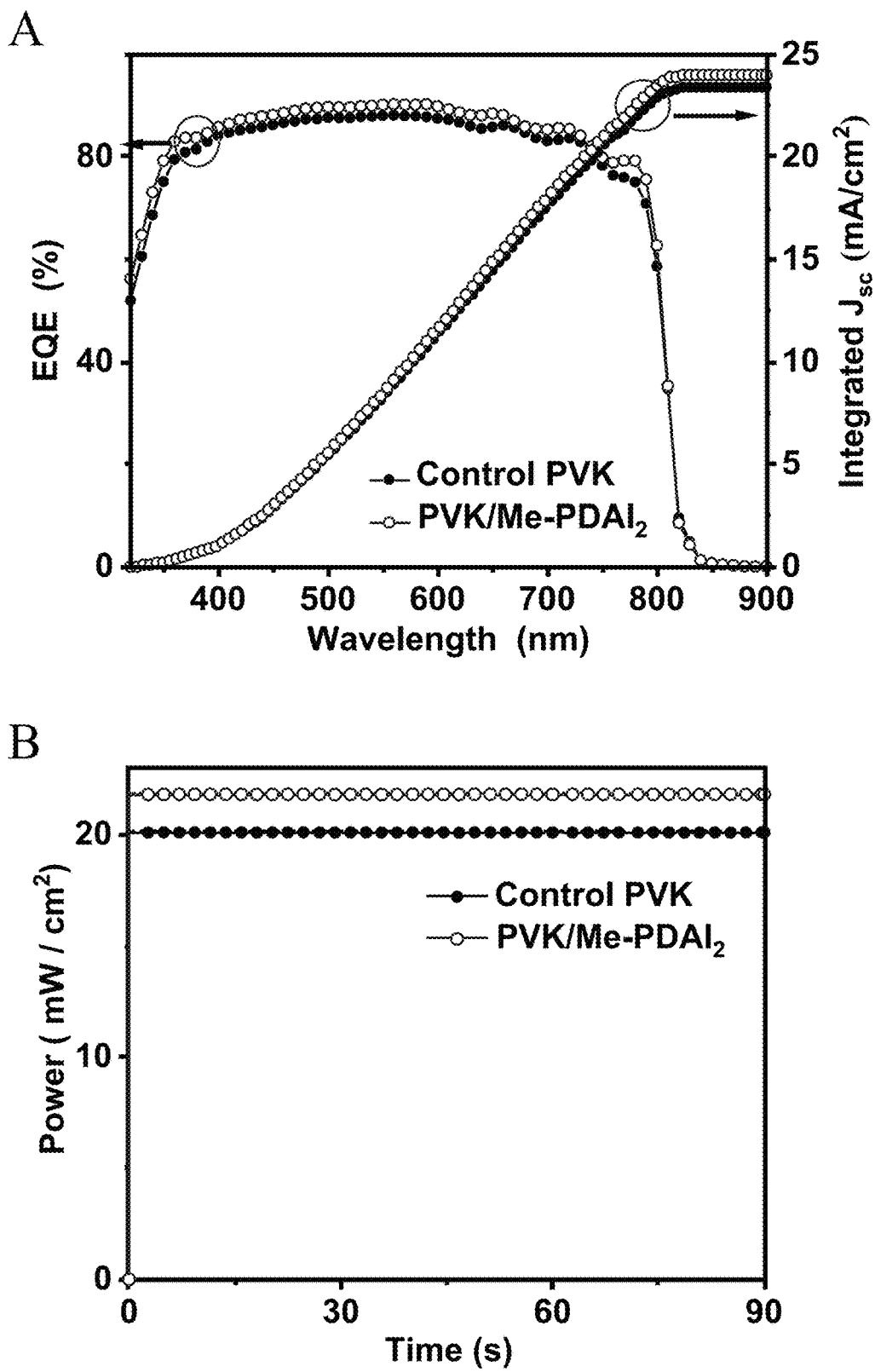
FIG. 16B illustrates (Panel A) EQE spectra with integrated current curves and (Panel B) SPO [define] of the represented in FIG. 16A, according to some embodiments of the present disclosure.
Figure 17:
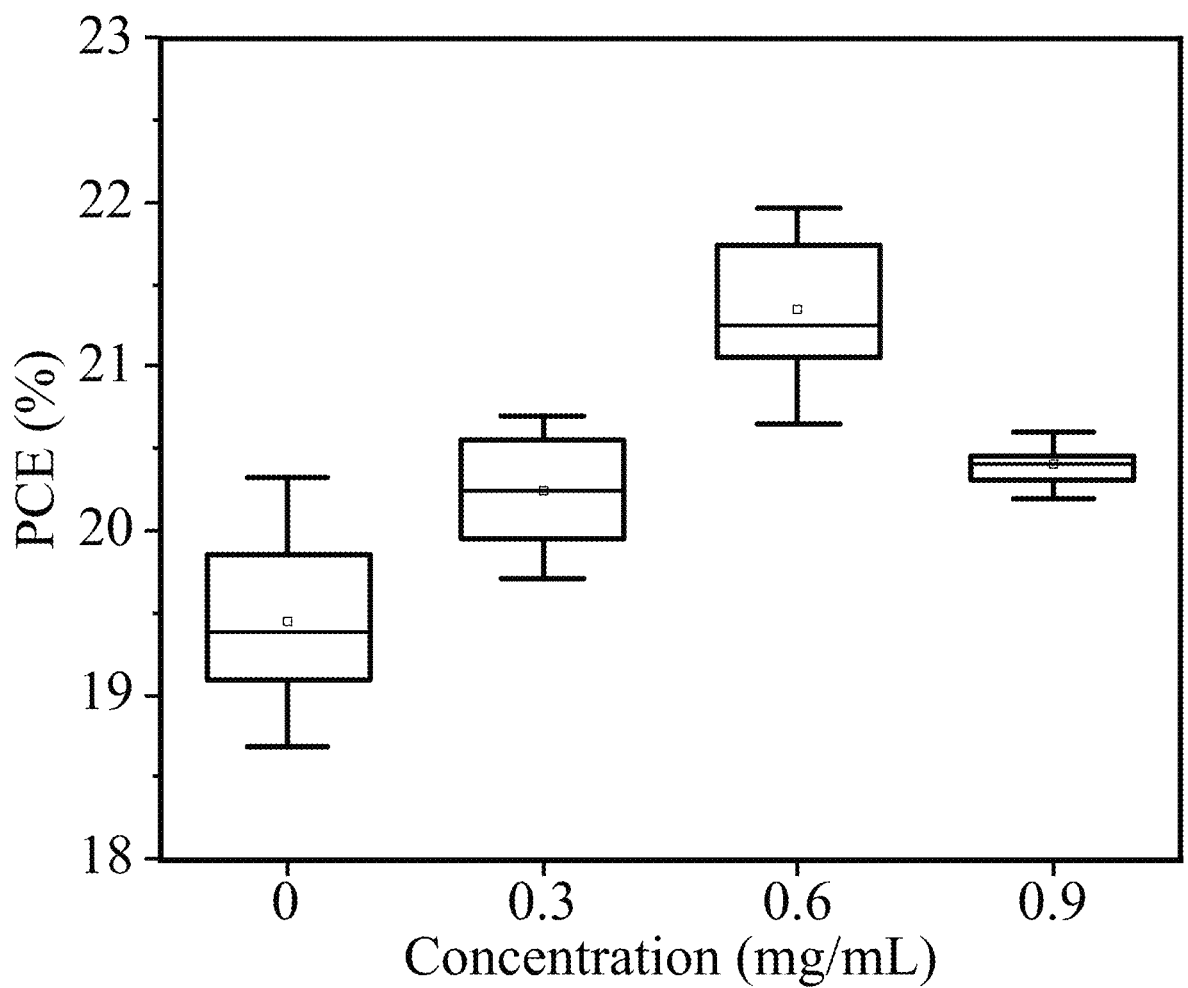
FIG. 17 illustrates a statistical distribution of PCE of perovskite solar cells based on perovskite absorbers treated with different concentrations of Me-PDAI$_2$ in IPA, according to some embodiments of the present disclosure.
Figure 18A:
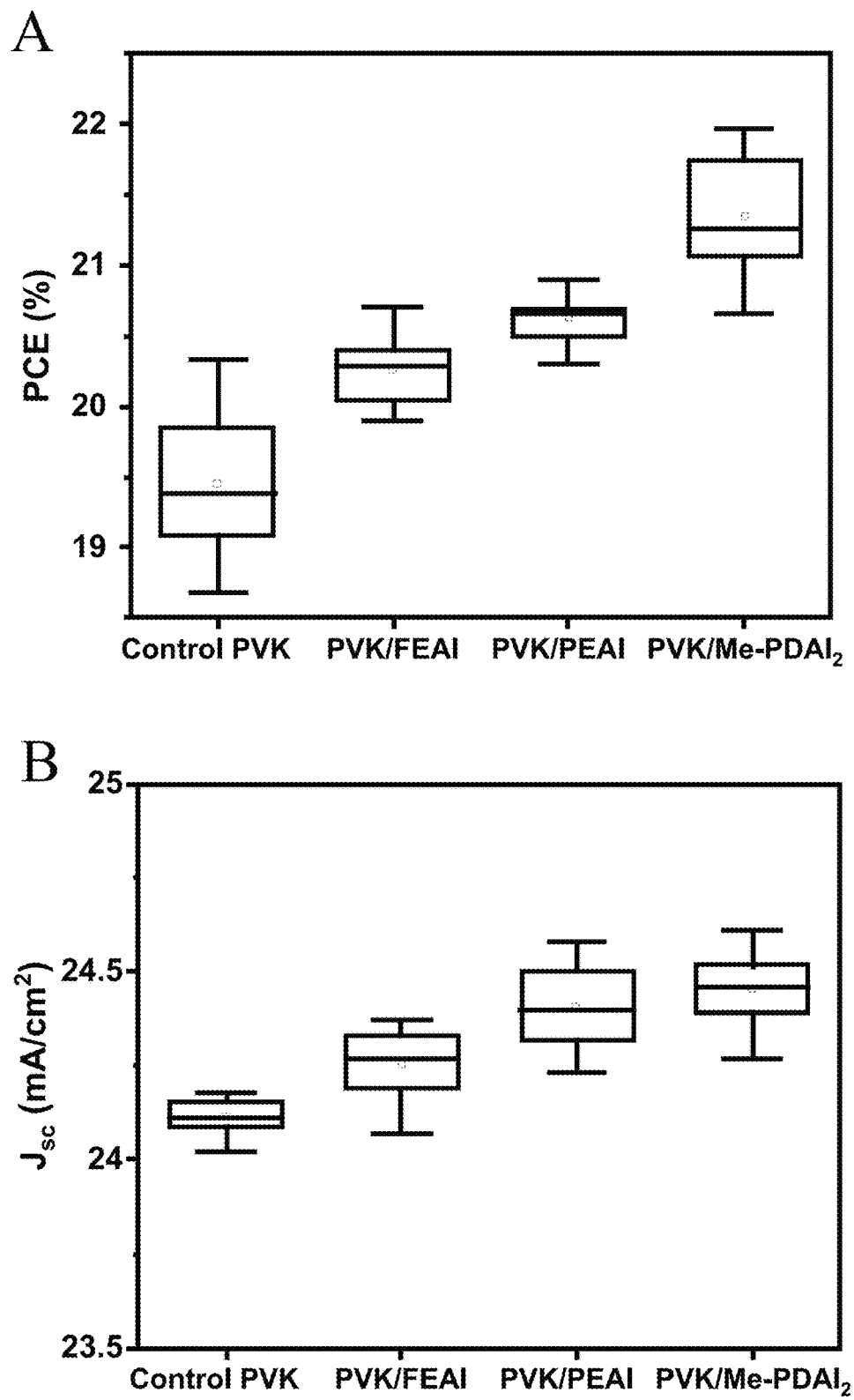
FIGS. 18A and 18B illustrate statistical distributions of photovoltaic (PV) parameters of perovskite solar cells based on control, FEAI-treated, PEAI-treated, and Me-PDAI$_2$-treated perovskite layers, according to some embodiments of the present disclosure.
Figure 18B:
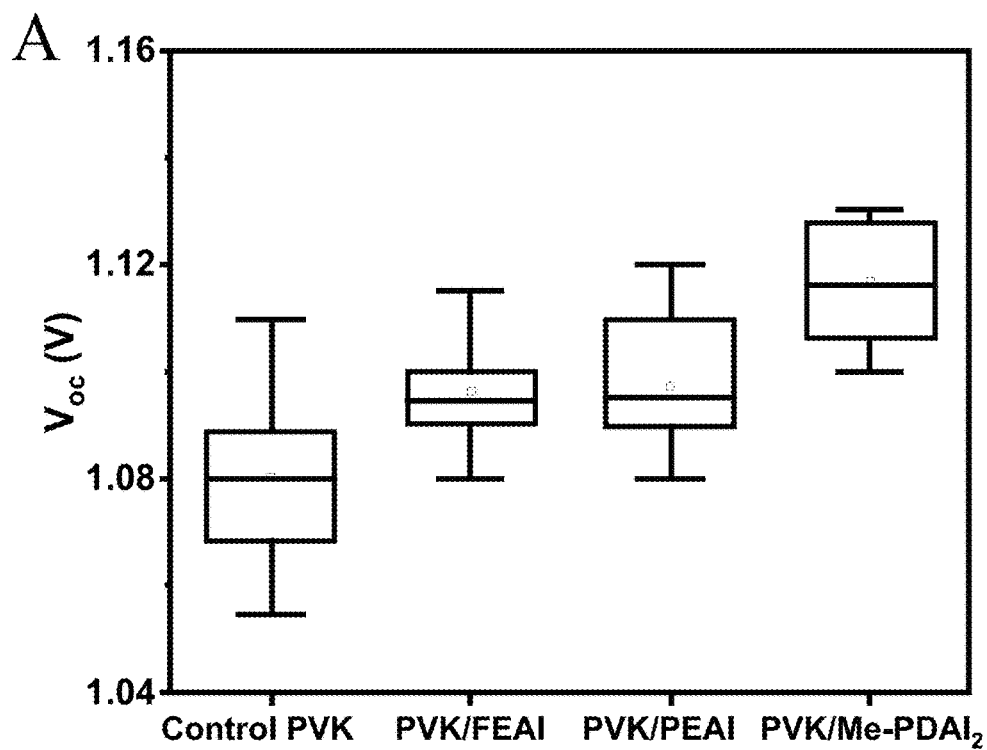
Figure 18B:
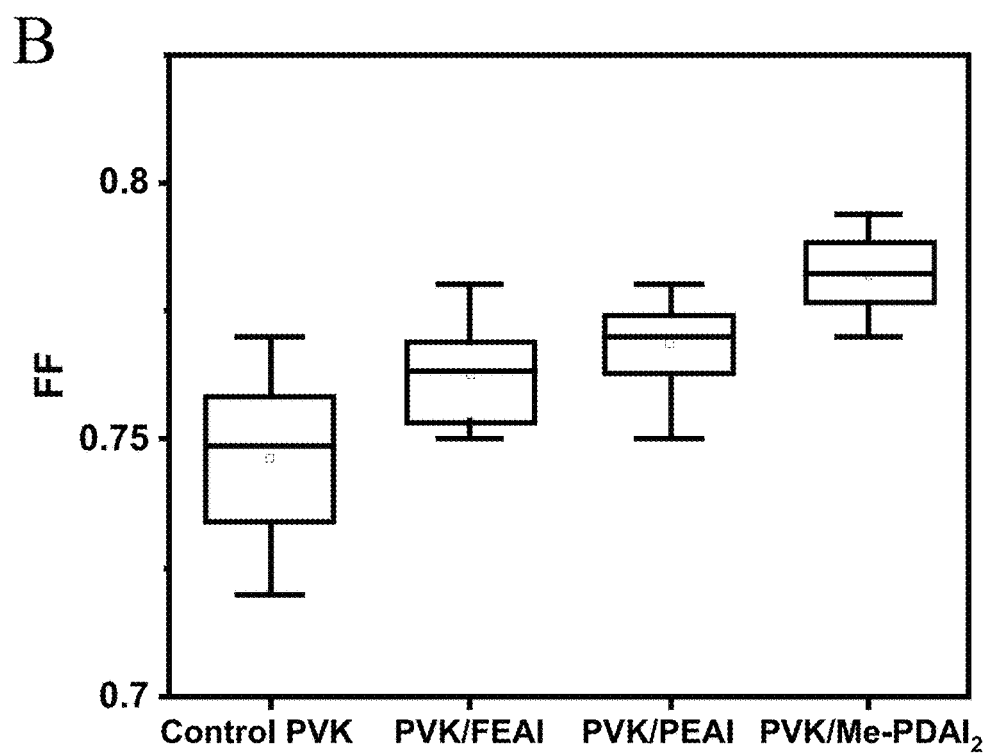
Figure 19:
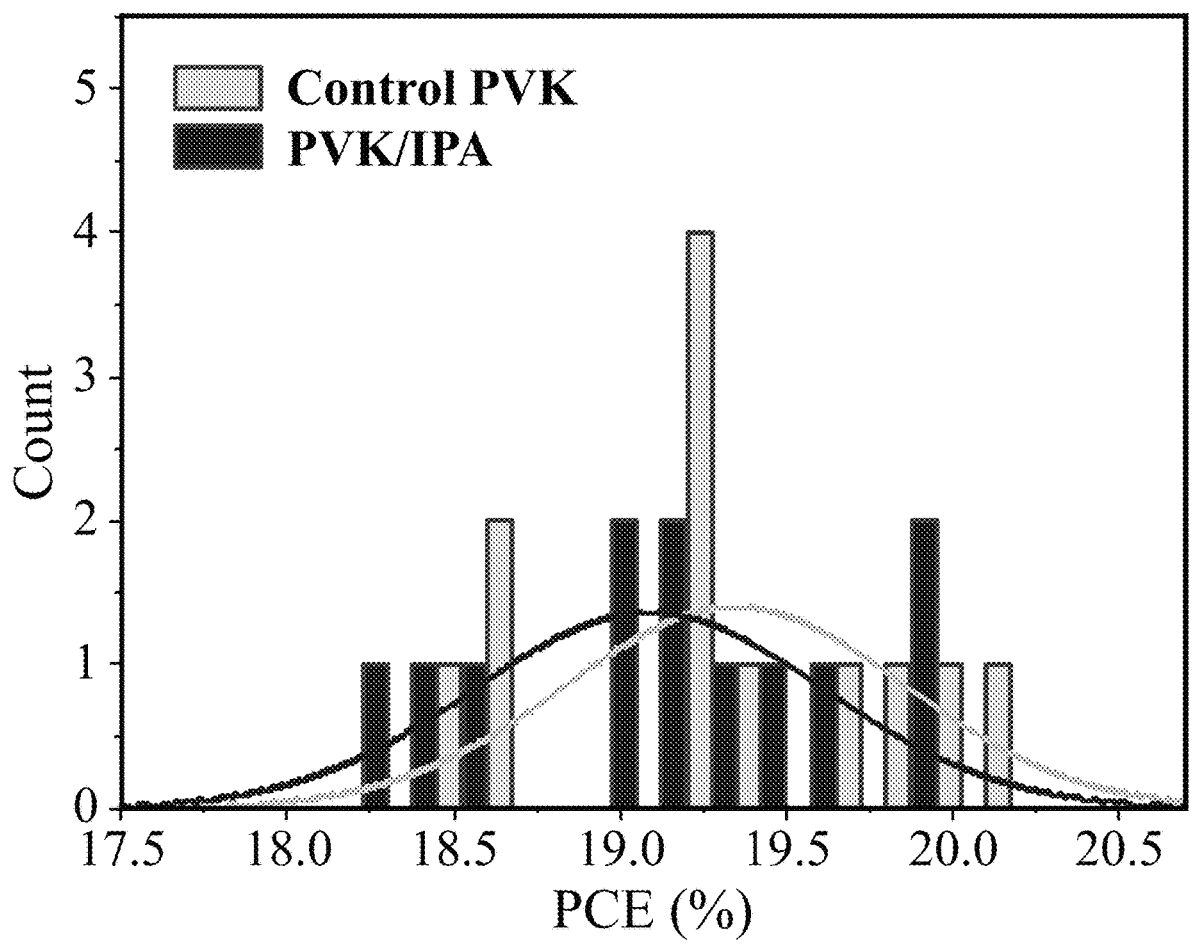
FIG. 19 illustrates a statistical distribution of PCE of perovskite solar cells based on control and IPA-treated perovskite layers, according to some embodiments of the present disclosure.
Figure 20A:
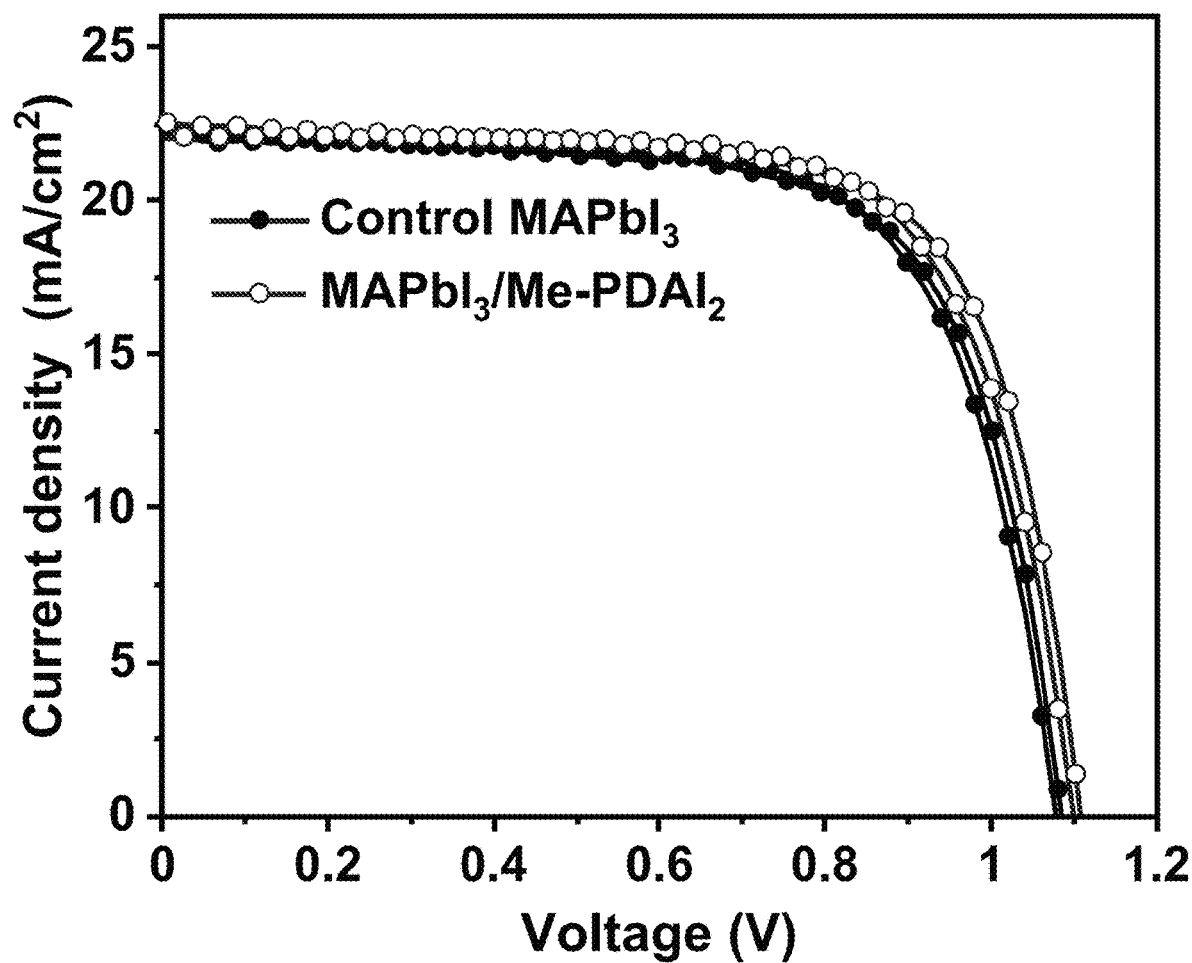
FIGS. 20A and 20B illustrate J-V curves of PSCs based on control perovskite and perovskite/Me-PDAI$_2$ layers, according to some embodiments of the present disclosure.
Figure 20B:
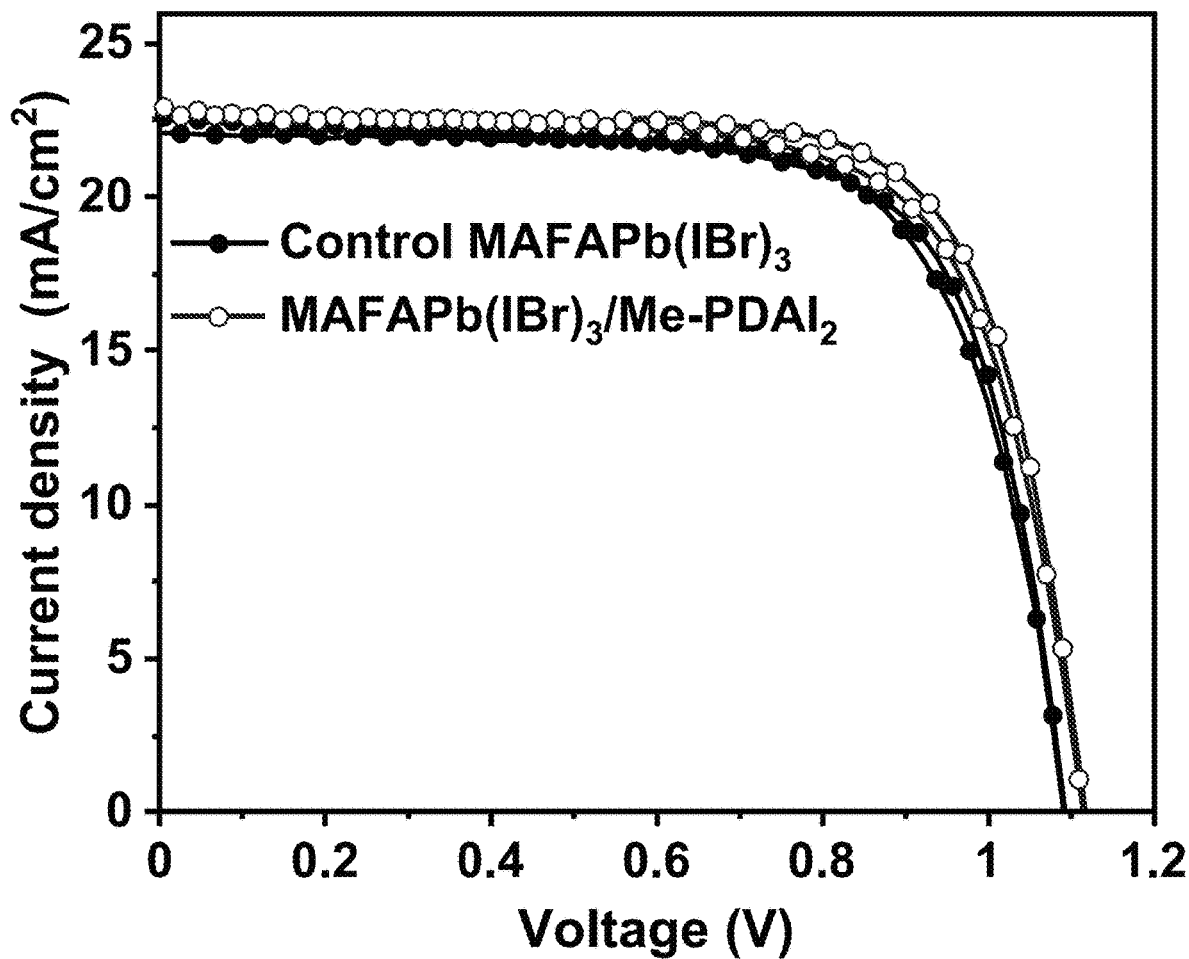

To investigate the potential impact of Me-PDAI$_2$ modification on photovoltaic (PV) performance, PSCs were fabricated using a mesoporous structure (control: glass/FTO/compact TiO$_2$/mesoporous TiO$_2$/perovskite/spiro-OMeTAD/Au; with Me-PDAI$_2$ treatment: glass/FTO/compact TiO$_2$/mesoporous TiO$_2$/perovskite/perovskitoid/spiro-OMeTAD/Au). The photocurrent density-voltage (J-V) curves of the control and Me-PDAI$_2$-treated PSCs under AM 1.5 G spectral irradiance with the light intensity of 100 mW/cm$^2$ are shown in Panels A and B of FIG. 16A. The corresponding PV parameters are summarized in the table insets. The control PSC showed a PCE of 20.3%, with J$_{sc}$ of 24.10 mA/cm$^2$, V$_{oc}$ of 1.11 V, and FF of 0.76. In contrast, Me-PDAI$_2$-treated PSCs at 0.6 mg/mL displayed much better performance of different concentrations, with a best PCE of 22.0% (see FIGS. 17, 18A, and 18B). The neat IPA treatment has little negative effect on the performance as shown in FIG. 19. The integrated current densities estimated from the external quantum efficiency (EQE) spectra of the corresponding PSCs are in good agreement with the J$_{sc}$ values obtained from the J-V curves (see Panel A of FIG. 16B). The stabilized power outputs (SPOs) in Panel B of FIG. 16B for the control and Me-PDAI$_2$-treated PSCs are 20.1% and 21.8%, respectively; these SPO values match well with the J-V measurements. FIG. 18 showed good reproducibility of the device performance by evaluating 12 cells. In addition to the CsFAMA-based perovskite composition, it was determined that the PCEs of MAPbI$_3$- and (FAPbI$_3$)$_{0.85}$(MAPbBr$_3$)$_{0.15}$-based PSCs have perovskite layers treated with Me-PDAI$_2$ were enhanced compared to the corresponding control PSCs, as shown in FIGS. 20A and 20B. This suggests that the Me-PDAI$_2$ treatment to form a perovskitoid surface layer is a general way to improve PSC performance and likely results in PSC performance improvements for many perovskite semiconductor compositions. The improved device performance is consistent with the longer lifetime, higher mobility, and lower surface-defect density observed in Me-PDAI$_2$-treated perovskite layers.

Although, the examples described herein utilize TiO$_2$ (Titanium dioxide) as an electron-transport material, this is for illustrative purposes only. Other ETMs (for use as ETLs) that may be suitable for PSC devices include at least one of SnO$_2$, ZnO, In$_2$O$_3$, Nb$_2$O$_5$, Zn$_2$SnO$_4$, BaSnO$_3$ and/or SrTiO$_4$.

Figure 16C:
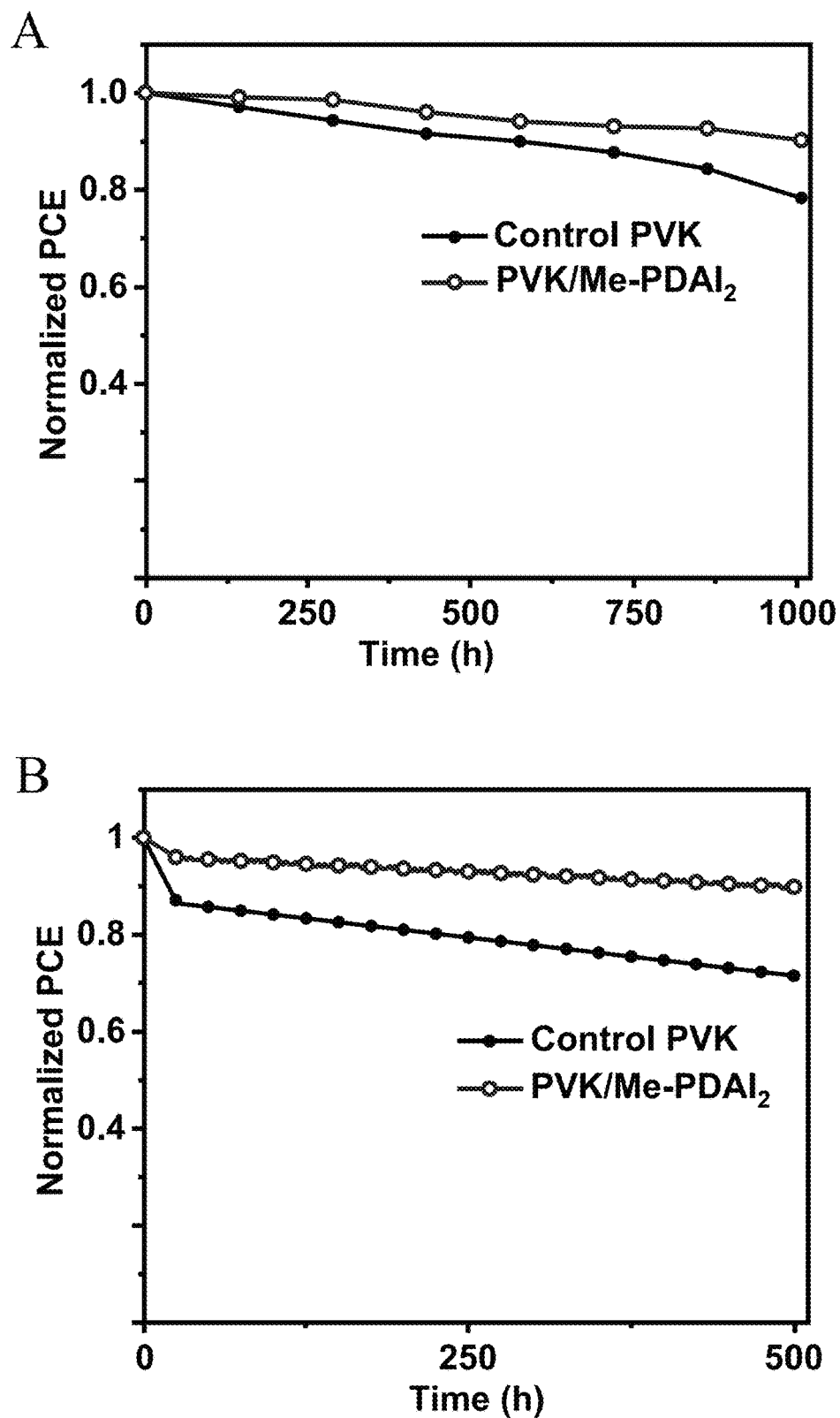
FIG. 16C illustrates a stability comparison of (Panel A) shelf ISOS-D-1 stability (room temperature, 20%-40% relative humidity) and (Panel B) operation ISOS-L-1 stability (maximum power-point tracking, in N$_2$, continuous one-sun illumination) of control devices to those treated with Me-PDAI$_2$, according to some embodiments of the present disclosure. Devices were not encapsulated.
Figure 21:
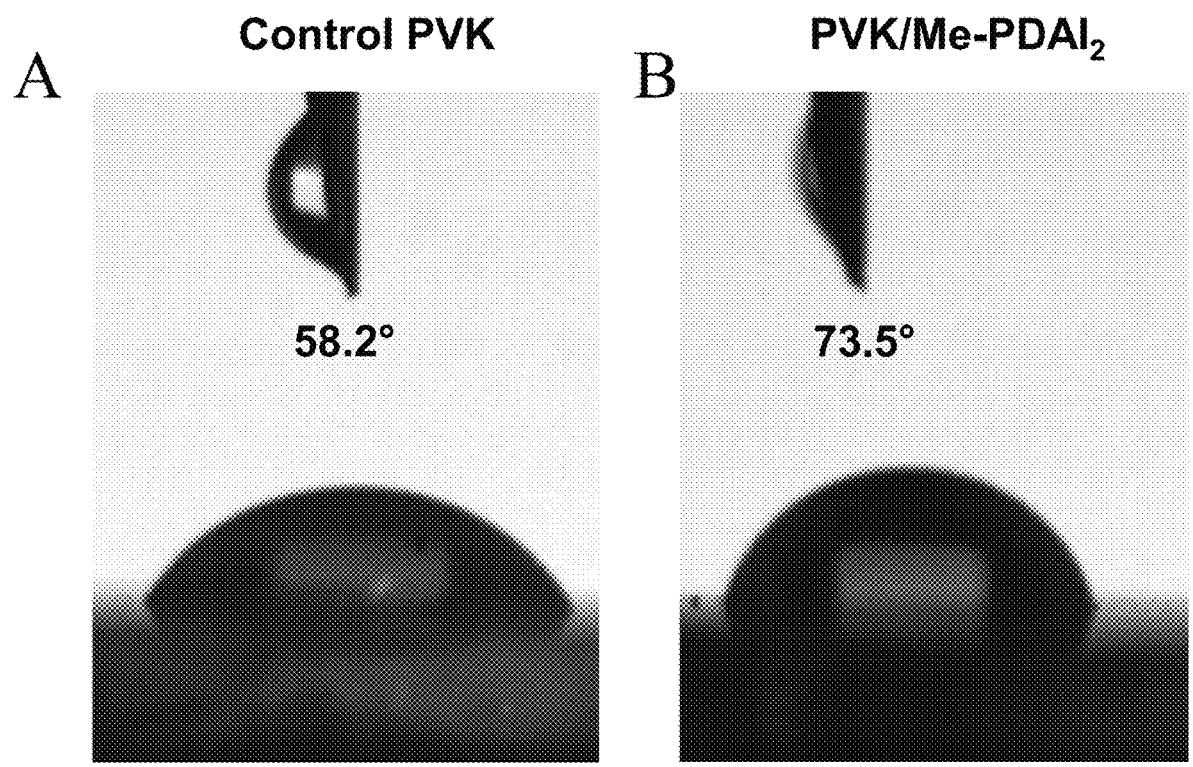
FIG. 21 illustrates contact-angle measurement of water droplet on the (Panel A) control and (Panel B) Me-PDAI$_2$-treated perovskite layers, according to some embodiments of the present disclosure.

PSC stability was also evaluated. Panel A of FIG. 16C shows the shelf stability (ISOS-D-1 stability) of unencapsulated PSCs in ambient with 20%-40% relative humidity at room temperature. After about 1008 hours, the PCE of Me-PDAI$_2$-treated PSCs dropped to 90% compared to the initial performance, whereas the control PSCs showed about 22% degradation. The ISOS-L-1 stability results of unencapsulated devices under normal working conditions at continuous maximum power-point (MPP) tracking in N$_2$ are shown in Panel B of FIG. 16C. The unencapsulated Me-PDAI$_2$-modified and control PSCs showed 10% and 28% degradations after 500 h, respectively. The improved stability of the Me-PDAI$_2$-treated PSCs is consistent with the better hydrophobicity (see FIG. 21) as well as the improved carrier lifetime, higher mobilities, and decreased surface-defect density.

Figure 22A:
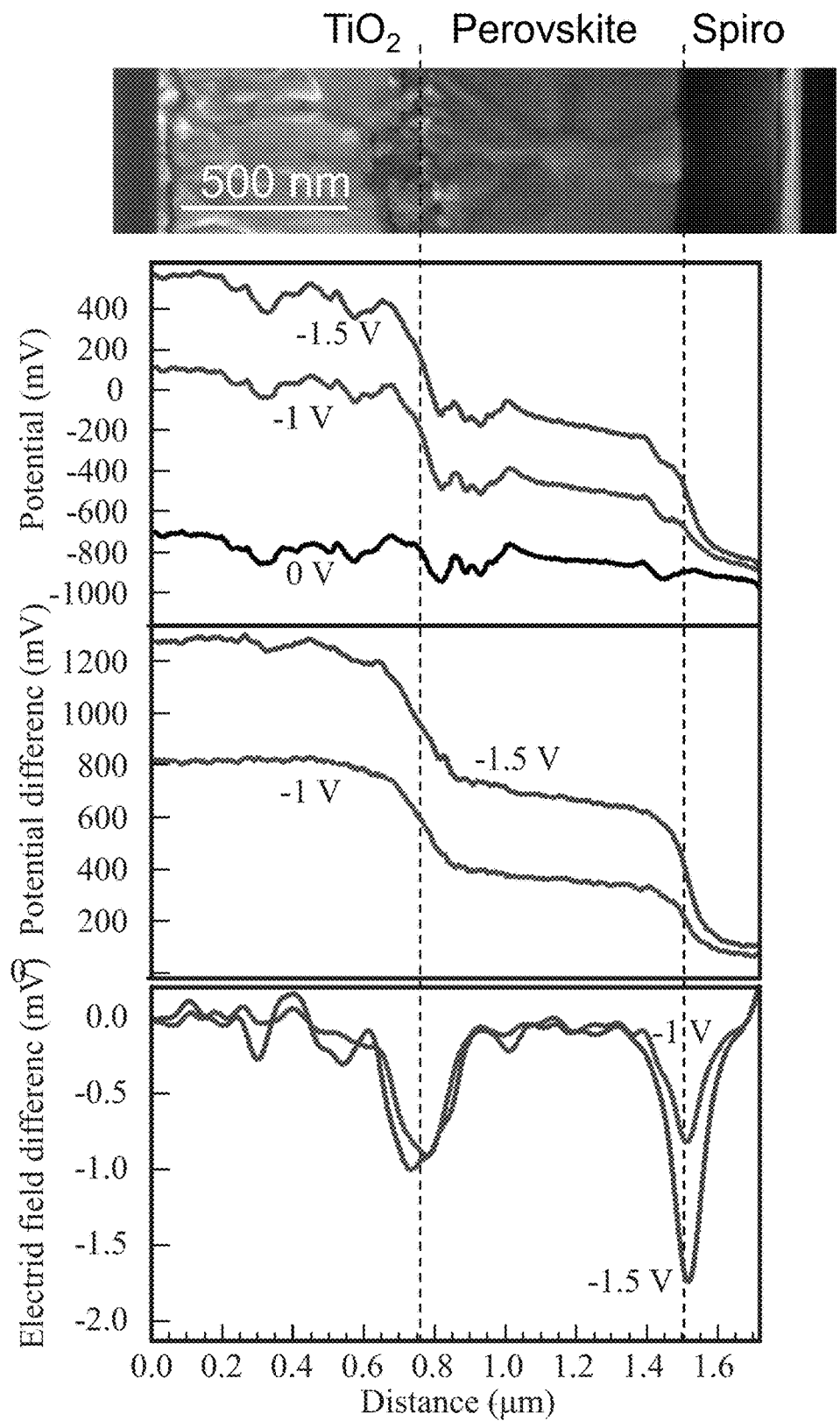
FIGS. 22A and 22B illustrate Kelvin probe force microscopy electrical potential and field profiling on the cross-sectional surface of (FIG. 22A) control and (FIG. 22B) Me-PDAI$_2$-treated devices, according to some embodiments of the present disclosure. In each figure, the top graph illustrates potential profile under 0 V, –1 V, and –1.5 V bias voltages; the middle plot illustrates potential difference between the various applied bias voltages and 0 V; and the bottom figure illustrates the change in electric field calculated by taking the first derivatives of the potential difference.
Figure 22B:
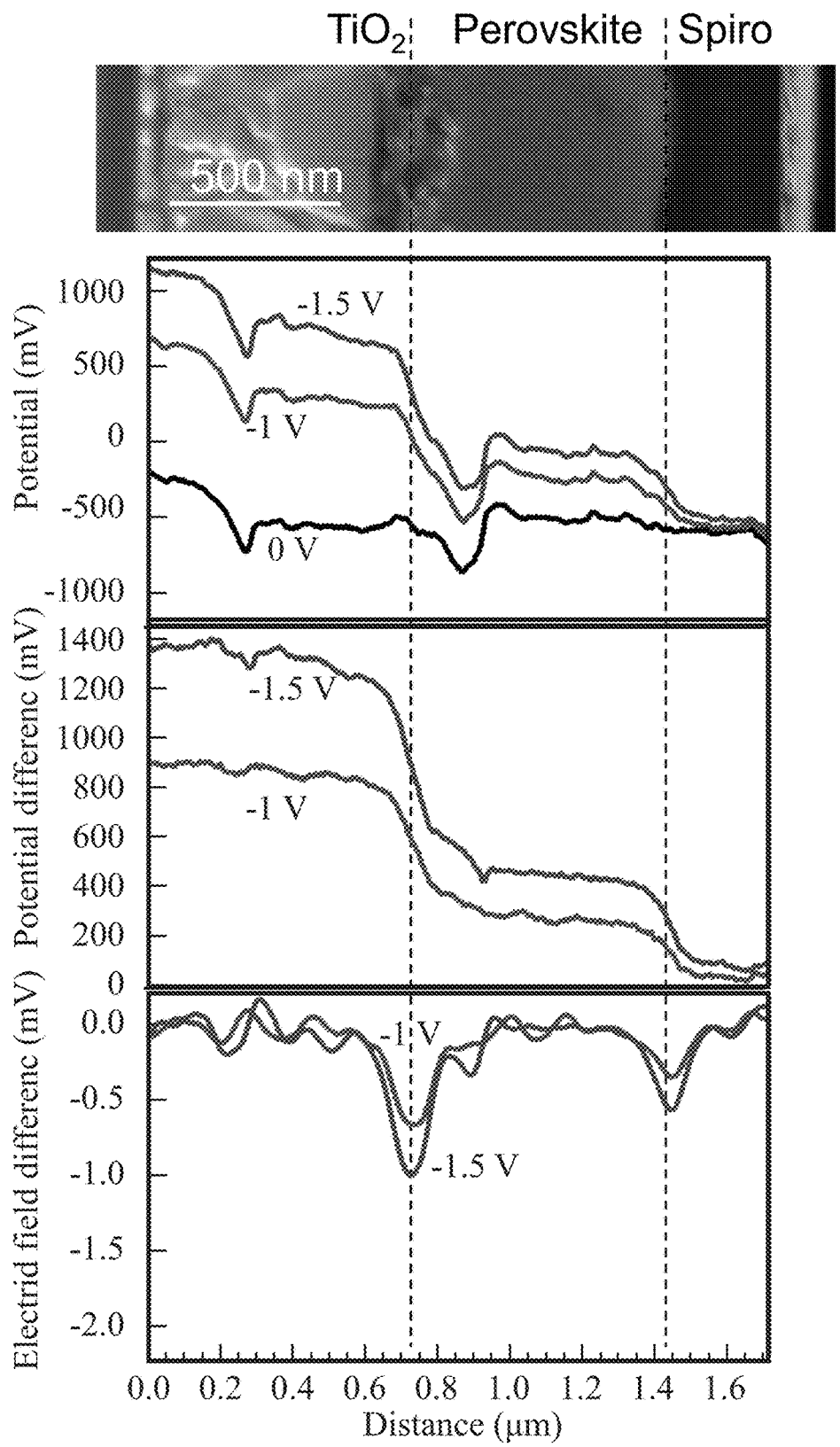

In addition, cross-sectional Kelvin probe force microscopy (KPFM) was performed to examine the quality of interfaces of the corresponding devices. The results are shown in FIGS. 22A and 22B. In KPFM measurements, bias voltages are applied, and the current should be even across the whole device stack; KPFM maps the potential distribution on the cross-sectional surface, and it can be used to determine the interface quality. The local voltage drop across the device is determined by the competition of equivalent resistance of different layers and interfaces, which can be related to the interface quality. Because the electron-transport layer (ETL)/perovskite interface should be identical for these two devices, we normalized the ETL/perovskite peak to compare the "back-contact" quality at the perovskite/HTL interfaces between these two devices. In the bottom row of FIG. 22B, the Me-PDAI$_2$-treated device showed a significantly smaller perovskite/HTL electric-field difference peak than that of the control perovskite devices (see FIG. 22A). The smaller perovskite/HTL peak indicates a less leaky junction in the Me-PDAI$_2$-treated device, which suggests a better back-contact quality that can decrease the energy loss associated with carrier transport over the interface for higher FF and V$_{oc}$ in devices.

Methods

Materials. Lead oxide (PbO, 99.999%), N-methyl-1,3-propanediamine (Me-PDA, 98%), N,N-anhydrous dimethylformamide (DMF), chlorobenzene (CB), dimethyl sulfoxide (DMSO), and 57% aqueous hydriodic acid (HI) solution (99.95%, distilled, stabilized by H$_3$PO$_2$) were purchased from Sigma-Aldrich and used as-received without any other refinement unless otherwise specified. FAI and MABr were purchased from Greatcell Solar. PbI$_2$ and PbBr$_2$ were purchased from TCI Corporation. Spiro-OMeTAD was received from Merck Corporation. The titanium diisopropoxide bis(acetylacetonate), bis(trifluoromethanesulfonyl)imide lithium salt, tert-butylpyridine, and CsI were purchased from Sigma-Aldrich. Substrates are patterned fluorine-doped tin-oxide-coated glass (<15 Ω/square) obtained from Advanced Election Technology Co., Ltd.

Synthesis of N-methyl-1,3-propane diammonium diiodine (Me-PDAI$_2$). 5 mL N-methyl-1,3-propanediamine (Me-PDA) was first mixed with 15 mL ethanol (200 Proof), and the solution was placed in an ice water bath (0° C.). 20 mL HI solution was slowly added to the Me-PDA solution (dropwise). The mixture was allowed to stir for 2 hours. After the reaction, solvents were removed by vacuum, and white powders were collected by vacuum filtration. The product was recrystallized from ethanol/diethyl ether and dried in vacuum overnight.

Synthesis of (Me-PDA)Pb$_2$I$_6$ single crystals. 254 mg (1.14 mmol) of PbO and 392 mg (1.14 mmol) of Me-PDAI$_2$ are fully dissolved in 5 mL of HI solution at 90° C. The solution is then slowly cooled to room temperature at a rate of 1° C./h, giving red needle-like crystals. The crystals are then isolated from the parent solution by vacuum filtration and dried under vacuum. The (Me-PDA)Pb$_2$I$_6$ perovskitoid layer was obtained from spin-coating the precursor by dissolving the (Me-PDA)Pb$_2$I$_6$ single crystals in DMF at 0.25 M.

Device Fabrication. Devices were prepared on conductive fluorine-doped tin oxide (FTO)-coated glass substrates. The substrates were cleaned extensively by deionized water, acetone, and isopropanol. A compact titanium dioxide (TiO$_2$) layer of about 40 nm was deposited by spray pyrolysis of 7-mL 2-propanol solution containing 0.6-mL titanium diisopropoxide bis(acetylacetonate) solution (75% in 2-propanol, Sigma-Aldrich) and 0.4-mL acetylacetone at 450° C. in air. On top of this layer, mesoporous titanium dioxide was formed by spin-coating 30-nm-sized nanoparticles (Dyesol 30NRD, Dyesol) diluted in ethanol (1:5.5 w/w) at 4500 rpm for 15 s. The (FAPbI$_3$)$_{0.85}$(MAPbI$_2$Br)$_{0.10}$(CsPbI$_3$)$_{0.05}$ precursor solution was prepared in a glovebox from a 1.35 M Pb$^{2+}$ with 5% excess of PbI$_2$ and in the mixed solvent of DMF and DMSO; the volume ratio of DMF/DMSO is 4:1. The spin-coating procedure was performed by 2000 rpm for 10 s followed with 6000 rpm for 30 s. At 15 s before the last spin-coating step, 140 □L of chlorobenzene were pipetted onto the substrate. Thereafter, the substrate was put onto a hotplate for 20 min at 120° C., which is called "control PVK" samples. For Me-PDAI$_2$ treatment, different concentration of Me-PDAI$_2$ was dissolved in IPA and spin-coated on the surface of the perovskite at 3,000 rpm for 30 s without followed annealing for 2 min at 100° C. in which we called the best condition as "PVK/Me-PDAI$_2$" samples. Subsequently, the hole-transport layer (HTM) was deposited on top of the perovskite by spin coating at 4500 rpm for 15 s. The spiro-OMeTAD solutions were prepared dissolving the spiro-OMeTAD in 1-mL chlorobenzene at a concentration of 77.6 mg/mL, with the addition of 20.6 μl bis(trifluoromethanesulfonyl)imide lithium salt from a stock solution in acetonitrile, 35.5 μL of tert-butylpyridine. The devices were finalized by thermal evaporation of 100-nm gold.

Measurements and Characterizations. SEM (FEI Nova 630, field-emission gun) imaging was performed with an electron-beam voltage of 3 kV and current of 3 nA in the immersion-lens mode. The XRD of the perovskite layers was characterized using a Rigaku D-Max 2200 diffractometer with Cu Kα radiation. The optical absorption spectra of perovskite layers were measured using an ultraviolet/visible (UV/Vis) spectrophotometer (Cary 6000i). For powder absorption, powder samples were first obtained by grinding single crystals using mortar and pestle. Linear optical absorption spectra were obtained by performing optical diffuse reflectance measurements in a Cary 5000 UV-vis-NIR spectrometer operating in the 800-300-nm region at room temperature. $BaSO_4$ was used as the reference of 100% reflectance and to dilute powder samples for all measurements. Linear optical absorption spectra of powders were generated by converting reflectance to absorption data using the Kubelka-Munk equation: $\alpha/S=(1-R)^2/(2R)$, where R is the reflectance and $\alpha$ and S are the absorption and scattering coefficients, respectively. Solar cell performance measurements were taken under a simulated AM 1.5G illumination (100 mW/$cm^2$, Oriel Sol3A Class AAA Solar Simulator). The photocurrent density-voltage (J-V) characteristics were measured using a Keithley 2400 source meter. The J-V curves of all devices were measured by masking the active area with a metal mask of area 0.12 $cm^2$. Both backward-scan and forward-scan curves were measured with a bias step of 10 mV and delay time of 0.05 s. The continuous current and power output were measured using a potentiostat (Princeton Applied Research, Versa STAT MC). External quantum efficiency (EQE) spectra of solar cells were measured using a solar cell quantum-efficiency measurement system (QEX10, PV Measurements). KPFM and C-AFM measurements were performed inside an Ar-filled glovebox with water and oxygen level lower than 0.01 ppm. All the scans were collected via Nanosensor PPP-EFM tips. The KPFM mappings have a spatial resolution of 30 nm and an electrical resolution of 10 mV. We directly cleaved the cells inside the glovebox with no exposure to air or polishing/ion-milling treatments to flatten the surface. Then, SEM images were used to align to topography and mark the locations of interfaces. C-AFM scans were all acquired by one tip and the same scan conditions; at least two areas were examined to ensure the reliability of results. FTO substrate was connected to the AFM stage, and the applied bias voltage was 0.8 V. Stability measurements were performed with a Biologic MPG2 potentiostat under a full AM1.5 sun-equivalent white LED lamp. The devices were measured with a maximum power-point (MPP) tracking routine under continuous illumination (and nitrogen) at 20° C. The MPP was updated every 10 s by a standard perturb-and-observe method. Every 1 minute, a J-V curve was recorded to track the evolution of individual J-V parameters. Single-crystal structure analysis via X-ray diffraction was performed on a Bruker-Nonius X8 Proteum diffractometer at the University of Kentucky and at the ALS on a Bruker D8 Photon 100 diffractometer.

X-Ray Photoemission Spectroscopy (XPS) measurements were performed on a Physical Electronics 5600 photoelectron spectrometer. Briefly, radiation was produced by a monochromatic 350-W Al K$\alpha$ excitation centered at 1486.7 eV. XPS core-level spectra were collected using a step size of 0.1 eV and pass energy of 11.75 eV. The electron binding energy scale was calibrated using the Fermi edge of a copper substrate, cleaned with argon ion bombardment. Peak areas were fit using a Gaussian-Lorentzian peak-fitting algorithm with a Shirley background. Spectra taken with the Al source are typically assigned an uncertainty of 0.05 eV. Compositional analyses and deconvolutions are typically assigned an uncertainty of 5%.

EXAMPLES

Example 1. A composition comprising: a first layer comprising a perovskite; and a second layer comprising a perovskitoid, wherein: the perovskite has a first crystalline structure comprising $ABX_3$, the perovskitoid has a second crystalline structure comprising $A'B_2X_6$, A comprises a first cation, B comprises a second cation, X comprises an anion, and A' comprises a third cation having either a 1+ charge or a 2+ charge.

Example 2. The composition of Example 2, wherein A' has a characteristic length between 2.53 Å and 7.62 Å.

Example 3. The composition of either Example 1 or 2, wherein the characteristic length is between 2.72 Å and 7.06 Å.

Example 4. The composition of any one of Examples 1-3, wherein the second crystalline structure comprises a 3D crystal structure.

Example 5. The composition of any one of Examples 1-4, wherein the 3D structure has a centrosymmetric orthorhombic space group Pbam.

Example 6. The composition of any one of Examples 1-5, wherein the second crystalline structure is characterized by having at least one octahedra dimer having a composition consisting of $Pb_2I_6^{2-}$.

Example 7. The composition of any one of Examples 1-6, wherein A' comprises at least one of N-methyl-1,3-propane diammonium (Me-PDA) or 1,4-bis(aminomethyl)benzene (p-PBA).

Example 8. The composition of any one of Examples 1-7, wherein the second crystalline structure comprises (Me-PDA)$Pb_2I_6$.

Example 9. The composition of any one of Examples 1-8, wherein the second crystalline structure comprises (p-PBA)$Pb_2I_6$.

Example 10. The composition of any one of Examples 1-9, wherein A comprises at least one of methylammonium (MA), formamidinium (FA), or cesium.

Example 11. The composition of any one of Examples 1-10, wherein B comprises at least one of lead or tin.

Example 12. The composition of any one of Examples 1-11, wherein X comprises a halide.

Example 13. The composition of any one of Examples 1-12, wherein the halide comprises at least one of iodide, bromide, or chloride.

Example 14. The composition of any one of Examples 1-13, wherein: the perovskite comprises $FA_{1-x-y}MA_xCs_yPb(I_{1-z}Br_z)_3$, $0 \leq x \leq 1$, $0 \leq y \leq 1$, and $0 \leq z \leq 1$.

Example 15. The composition of any one of Examples 1-14, wherein the perovskite is approximately equal to $(FAPbI_3)_{0.85}(MAPbI_2Br)_{0.10}(CsPbI_3)_{0.05}$.

Example 16. The composition of any one of Examples 1-15, wherein y equals zero.

Example 17. The composition of any one of Examples 1-16, wherein the perovskite is approximately equal to $(FAPbI_3)_{0.85}(MAPbBr_3)_{0.15}$.

Example 18. The composition of any one of Examples 1-17, wherein the second layer has a surface roughness less than or equal to about 16 nm.

Example 19. The composition of any one of Examples 1-18, wherein the surface roughness is between 5 nm and 16 nm, inclusively.

Example 20. The composition of any one of Examples 1-19, wherein the first layer has a thickness between about 100 nm and about 2000 nm.

Example 21. The composition of any one of Examples 1-20, wherein the second layer has a thickness between about 1 nm and about 100 nm.

Example 22. The composition of any one of Examples 1-21, wherein the composition has a yield mobility product ($\varphi\Sigma\mu$) of at least about 50.0 $cm^2$/Vs.

Example 23. The composition of any one of Examples 1-22, wherein $\varphi\Sigma\mu$ is between 50.0 $cm^2$/Vs and 100 $cm^2$/Vs.

Example 24. The composition of any one of Examples 1-23, wherein the composition has a charge-carrier lifetime of at least about 1.5 microseconds.

Example 25. The composition of any one of Examples 1-24, wherein the charge-carrier lifetime is between 1.5 microseconds and 5.0 microseconds.

Example 26. The composition of any one of Examples 1-25, wherein the composition has an out-of-plane charge transport between $(1-3)\times 10^{-3}$ cm$^2$V$^{-1}$s$^{-1}$ and $1\times 10^{-1}$ cm$^2$V$^{-1}$s$^{-1}$.

Example 27. The composition of any one of Examples 1-26, wherein the out-of-plane charge transport is between $(1-3)\times 10^{-3}$ cm$^2$V$^{-1}$s$^{-1}$ and $(3-8)\times 10^{-2}$ cm$^2$V$^{-1}$s$^{-1}$.

Example 28. The composition of any one of Examples 1-27, wherein the second layer uniformly covers the first layer.

Example 29. The composition of any one of Examples 1-28, wherein the composition is characterized by a peak at less than 10°, as measured by XRD.

Example 30. The composition of any one of Examples 1-29, wherein the composition is characterized by a free-carrier lifetime have a fast component value equal to at least 76 ns, as measured by photoluminescence (PL) decay.

Example 31. The composition of any one of Examples 1-30, wherein the composition is characterized by a free-carrier lifetime have a slow component value equal to at least 200 ns, as measured by photoluminescence (PL) decay.

Example 32. A device comprising: a first layer comprising a perovskite; and a second layer comprising a perovskitoid, wherein: the perovskite has a first crystalline structure comprising ABX$_3$, the perovskitoid has a second crystalline structure comprising A'B$_2$X$_6$, A comprises a first cation, B comprises a second cation, X comprises an anion, and A' comprises a third cation having either a 1+ charge or a 2+ charge.

Example 33. The device of Example 32, further comprising a hole-transfer layer (HTL), wherein the second layer is positioned between the first layer and the HTL.

Example 34. The device of either Example 32 or 33, wherein the HTL comprises at least one of spiro-OMeTAD, poly[bis(4-phenyl)(2,4,6-trimethylphenyl)amine, poly(N,N'-bis-4-butylphenyl-N,N'-bisphenyl)benzidine, and nickel oxide, and/or a suitable self-assembling monolayer such as at least one of [2-(3,6-dimethoxy-9H-carbazol-9-yl)ethyl] phosphonic acid, ([4-(3,6-dimethyl-9H-carbazol-9-yl)butyl] phosphonic acid), (4-(4-(3,6-dimethoxy-9H-carbazol-9yl) butyl)phosphonic acid, or ([2-(9H-carbazol-9-yl)ethyl] phosphonic acid.

Example 35. The device of any one of Examples 32-34, further comprising an electron-transfer layer (ETL), wherein the first layer is positioned between the second layer and the ETL.

Example 36. The device of any one of Examples 32-35, wherein the ETL comprises at least one of TiO$_2$, SnO$_2$, ZnO, In$_2$O$_3$, Nb$_2$O$_5$, Zn$_2$SnO$_4$, BaSnO$_3$ or SrTiO.

Example 37. A device comprising, in order: a glass substrate; a layer comprising fluorine-doped tin oxide; a layer comprising compact TiO$_2$; a layer comprising mesoporous TiO$_2$; a layer comprising a perovskite; a layer comprising a perovskitoid; a layer comprising a hole-transport material (HTL); and a metal layer.

Example 38. The device of Example 37, wherein the perovskitoid comprises at least one of (Me-PDA)Pb$_2$I$_6$ or (p-PBA)Pb$_2$I$_6$.

Example 39. The device of either Example 37 or 38, wherein the perovskite comprises FA$_{1-x-y}$MA$_x$Cs$_y$Pb(I$_{1-z}$Br$_z$)$_3$, 0≤x≤1, 0≤y≤1, and 0≤z≤1.

Example 40. The device of any one of Examples 37-39, wherein the HTL comprises at least one of spiro-OMeTAD, poly[bis(4-phenyl)(2,4,6-trimethylphenyl)amine, poly(N,N'-bis-4-butylphenyl-N,N'-bisphenyl)benzidine, and nickel oxide, and/or a suitable self-assembling monolayer such as at least one of [2-(3,6-dimethoxy-9H-carbazol-9-yl)ethyl] phosphonic acid, ([4-(3,6-dimethyl-9H-carbazol-9-yl)butyl] phosphonic acid), (4-(4-(3,6-dimethoxy-9H-carbazol-9yl) butyl)phosphonic acid, or ([2-(9H-carbazol-9-yl)ethyl] phosphonic acid.

Example 41. The device of any one of Examples 32-40, wherein the metal comprises at least one of silver, gold, copper, or molybdenum.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure.

The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
a first layer comprising a perovskite; and
a second layer comprising a perovskitoid, wherein:
the perovskite has a first crystalline structure comprising ABX$_3$,
the perovskitoid has a second crystalline structure comprising A'B$_2$X$_6$,
A comprises a first cation, B comprises a second cation, X comprises an anion, and A' comprises a third cation having either a 1+ charge or a 2+ charge.

2. The composition of claim 1, wherein A' has a characteristic length between 2.53 Å and 7.62 Å.

3. The composition of claim 2, wherein the characteristic length is between 2.72 Å and 7.06 Å.

4. The composition of claim 1, wherein the second crystalline structure comprises a 3D crystal structure.

5. The composition of claim 4, wherein the 3D structure has a centrosymmetric orthorhombic space group Pbam.

6. The composition of claim 1, wherein the second crystalline structure is characterized by having at least one octahedra dimer having a composition consisting of Pb$_2$I$_6^{2-}$.

7. The composition of claim 1, wherein A' comprises at least one of N-methyl-1,3-propane diammonium (Me-PDA) or 1,4-bis(aminomethyl)benzene (p-PBA).

8. The composition of claim 7, wherein the second crystalline structure comprises at least one of (Me-PDA)Pb$_2$I$_6$ or (p-PBA)Pb$_2$I$_6$.

9. The composition of claim 1, wherein:
the perovskite comprises FA$_{1-x-y}$MA$_x$C$_{Sy}$Pb(I$_{1-z}$Br$_z$)$_3$, 0≤x≤1, 0≤y≤1, and 0≤z≤1.

10. The composition of claim 1, wherein the second layer has a surface roughness less than or equal to about 16 nm.

11. The composition of claim 1, wherein the composition has a yield mobility product (φΣμ) of at least about 50.0 cm$^2$/Vs.

12. The composition of claim 1, wherein the composition has a charge-carrier lifetime of at least about 1.5 microseconds.

13. The composition of claim 1, wherein the composition has an out-of-plane charge transport between (1-3)×10$^{-3}$ cm$^2$V$^{-1}$s$^{-1}$ and 1×10$^{-1}$ cm$^2$V$^{-1}$s$^{-1}$.

14. The composition of claim 1, wherein the second layer uniformly covers the first layer.

15. The composition of claim 1, wherein the first layer has a thickness between about 100 nm and about 2000 nm.

16. The composition of claim 1, wherein the second layer has a thickness between about 1 nm and about 100 nm.

17. The composition of claim 1, wherein the composition has a charge-carrier lifetime between 1.5 microseconds and 5.0 microseconds.

18. The composition of claim 1, wherein the composition is characterized by a peak at less than 10°, as measured by XRD.

19. A device comprising:
a first layer comprising a perovskite; and
a second layer comprising a perovskitoid, wherein:
the perovskite has a first crystalline structure comprising ABX$_3$,
the perovskitoid has a second crystalline structure comprising A'B$_2$X$_6$,
A comprises a first cation, B comprises a second cation, X comprises an anion, and A' comprises a third cation having either a 1+ charge or a 2+ charge.

20. A device comprising, in order:
a glass substrate;
a layer comprising fluorine-doped tin oxide;
a layer comprising compact TiO$_2$;
a layer comprising mesoporous TiO$_2$;
a layer comprising a perovskite;
a layer comprising a perovskitoid;
a layer comprising a hole-transport material (HTL); and
a metal layer, wherein:
the perovskite has a first crystalline structure comprising ABX$_3$,
the perovskitoid has a second crystalline structure comprising A'B$_2$X$_6$,
A comprises a first cation, B comprises a second cation, X comprises an anion, and A' comprises a third cation having either a 1+ charge or a 2+ charge.

* * * * *